(12) United States Patent
Edelstein et al.

(10) Patent No.: US 9,047,881 B2
(45) Date of Patent: Jun. 2, 2015

(54) NONVOLATILE CORRUPTION RESISTENT MAGNETIC MEMORY AND METHOD THEREOF

(71) Applicant: U.S. Army Research Laboratory, Washington, DC (US)

(72) Inventors: Alan S. Edelstein, Alexandria, VA (US); Jonathan R. Petrie, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 245 days.

(21) Appl. No.: 13/725,473

(22) Filed: Dec. 21, 2012

(65) Prior Publication Data

US 2014/0043891 A1 Feb. 13, 2014

Related U.S. Application Data

(60) Provisional application No. 61/680,834, filed on Aug. 8, 2012.

(51) Int. Cl.
| | |
|---|---|
| *G11B 5/66* | (2006.01) |
| *G11B 5/09* | (2006.01) |
| *G11B 5/33* | (2006.01) |
| *G11C 11/16* | (2006.01) |
| *G11B 11/14* | (2006.01) |
| *G11B 11/03* | (2006.01) |

(52) U.S. Cl.
CPC .. *G11B 5/09* (2013.01); *G11B 5/33* (2013.01); *G11C 11/16* (2013.01); *G11B 5/332* (2013.01); *G11B 11/14* (2013.01)

(58) Field of Classification Search
CPC .......... G11B 5/82; G11B 5/012; G11B 5/743; G11B 5/3903; G11B 11/10582; G11B 2005/3996; G11B 5/3909; G11B 5/74; G11B 5/33; G11B 5/09; G11B 11/14; G11B 5/855; G11B 5/35; G11B 5/332; G11C 11/16
USPC ........... 360/313, 324–324.2, 135, 128, 125.3; 235/449, 450; 324/234, 235; 369/13.56
See application file for complete search history.

(56) References Cited

U.S. PATENT DOCUMENTS

| | | | | |
|---|---|---|---|---|
| 4,021,728 | A | * | 5/1977 | Makino et al. ................. 361/180 |
| 5,204,192 | A | | 4/1993 | Nakamura et al. |
| 5,293,031 | A | * | 3/1994 | Goto et al. ..................... 235/449 |

(Continued)

OTHER PUBLICATIONS

B.D. Cullity and C.D. Graham. "Introduction to Magnetic Materials," 2nd edition.pp. 383-394 2009.

(Continued)

*Primary Examiner* — Will J Klimowicz
(74) *Attorney, Agent, or Firm* — Lawrence E. Anderson

(57) ABSTRACT

A method and system for storing information in a nonvolatile memory comprising: a substrate comprising magnetic material operatively associated therewith, the magnetic material having at least one first portion of low permeability and at least one second portion of high permeability; a reader comprising a sensor for reading information by measuring the magnetic permeability for the at least one first portion and the at least one second portion; whereby the at least one first and second portions are subjected to a magnetic probe field from one of an external source, the sensor, or a combination of an external source and the sensor.

20 Claims, 28 Drawing Sheets

(56) References Cited

U.S. PATENT DOCUMENTS

| | | | |
|---|---|---|---|
| 5,764,567 | A | 6/1998 | Parkin |
| 6,072,382 | A | 6/2000 | Daughton et al. |
| 6,330,136 | B1 | 12/2001 | Wang et al. |
| 6,331,364 | B1 | 12/2001 | Baglin et al. |
| 6,349,053 | B1 | 2/2002 | Daughton et al. |
| 6,381,171 | B1 | 4/2002 | Inomata et al. |
| 6,383,597 | B1 | 5/2002 | Fullerton et al. |
| 6,383,598 | B1 | 5/2002 | Fullerton et al. |
| 6,418,048 | B1 | 7/2002 | Sin et al. |
| 6,462,641 | B1 | 10/2002 | Dieny et al. |
| 6,762,954 | B1 | 7/2004 | Edelstein |
| 6,947,319 | B1 | 9/2005 | Edelstein |
| 7,233,142 | B1 | 6/2007 | Edelstein |
| 8,325,442 | B2 | 12/2012 | Koui |
| 2002/0008948 | A1 | 1/2002 | Sasaki et al. |
| 2002/0047145 | A1 | 4/2002 | Nickel |
| 2002/0068195 | A1 | 6/2002 | Lundstrom |
| 2008/0102320 | A1 | 5/2008 | Edelstein et al. |
| 2010/0053795 | A1 | 3/2010 | Kudo et al. |
| 2014/0043709 | A1 | 2/2014 | Edelstein |

OTHER PUBLICATIONS

Zhimin,Y., et al., "Perspectives of Magnetic Recording System at 10 Tb/in2" Magnetic Recording Conference, 2009. APMRC '09. Asia-Pacific. 2009.

Evans, R.F.L., et al., "Thermally induced error: Density limit for magnetic data storage," Applied Physics Letters, 2012. 100(10): p. 102402-3.

Thompson, D.A., et al., "The Future of Magnetic Data Storage Technology," IBM Journal of Research and Development, 2000. 44(3): p. 311-322.

C. Kim, "Future Memory Technology Trends and Challenges," in Proceedings of the 7th International Symposium on Quality Electronic Design 2006, IEEE Computer Society. p. 513.

H. Sungjoo, "Memory Technology Trend and Future Challenges," Electron Devices Meeting (IEDM), 2010 IEEE International. 2010.

Makarov, A., et al. "Emerging memory technologies: Trends, challenges, and modeling methods," Microelectronics Reliability, 2012. 52(4): p. 628-634.

R.P. Cowburn, "The Future of Universal Memory" Materials Today, 2003. 6(7-8): p. 32-38.

Kryder, M. H., et al., "After Hard Drives—What Comes Next?," IEEE Transactions on, 45(10): p. 3406-3413 (2009).

H.J. Richter, "The Transition from Longitudinal to Perpendicular Recording," Journal of Physics D: Applied Physics, 2007. 40(9): p. R149.

Krush, K. "Sputter Parameters and Magnetic Properties of Permallory for Thin Film Heads," IEEE Transactions on Magnetics, vol. MAG-22, No. 5, p. 626 Sep. 1986.

R. Skomski and D.J. Sellmyer, "Intrinsic and Extrinsic Properties of Advanced Magnetic Materials," Handbook of Advanced Magnetic Materials, Y. Liu, D. Sellmyer, and D. Shindo, Editors. 2006, Springer US. p. 1-57.

Liou, S.H., et al., "Picotesla Magnetic Sensors for Low-Frequency Applications," Magnetics, IEEE Transactions on, 2011. 47(10): p. 3740-3743.

Ikeda,S., et al., "Magnetic Tunnel Junctions for Spintronic Memories and Beyond," Electron Devices, IEEE Transactions on, 2007. 54(5): p. 991-1002.

Edelstein, Alan, et al., "Phase-separated Fe and Co Particles in a BN Matrix," J. Appl. Phys., Apr. 15, 1987, pp. 3320-3322, vol. 61, No. 8, Ser. 2A.

Ohring, Milton, "The Materials Science of Thin Films," Academic Press, p. 224 (1992).

\* cited by examiner

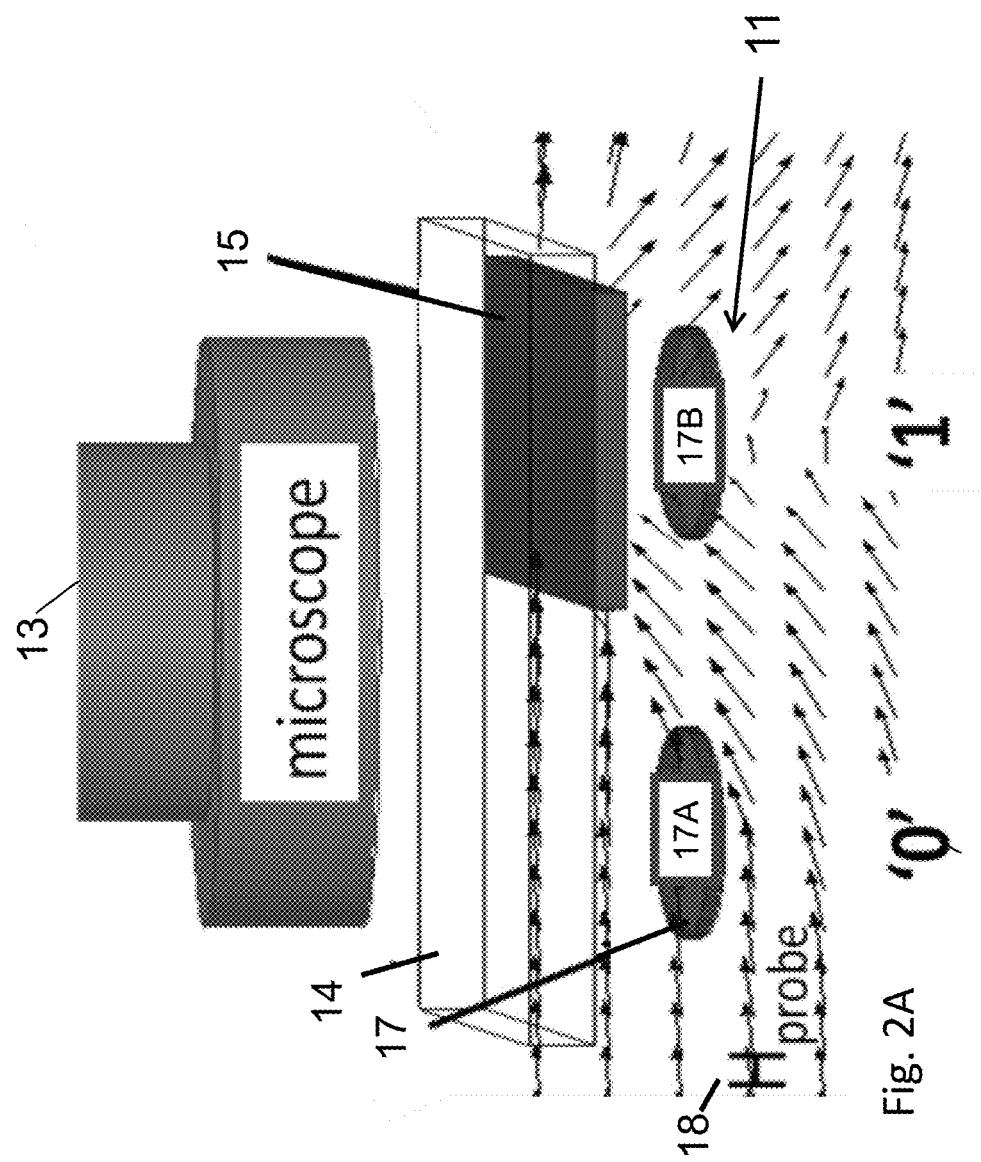

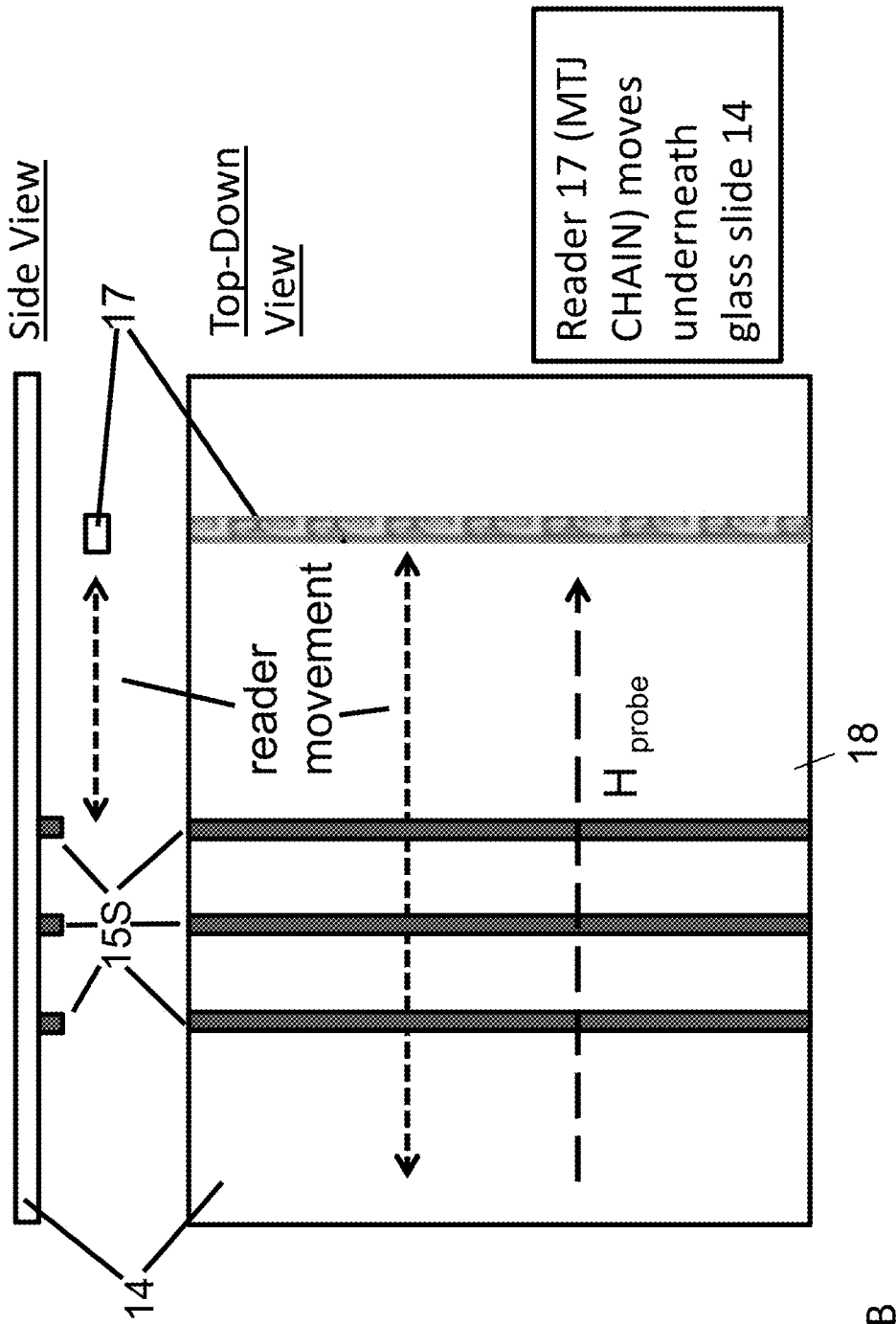
Fig. 2B  Permalloy stripes 15S are approx. 10 μm wide and ~50 μm apart on underneath side of glass

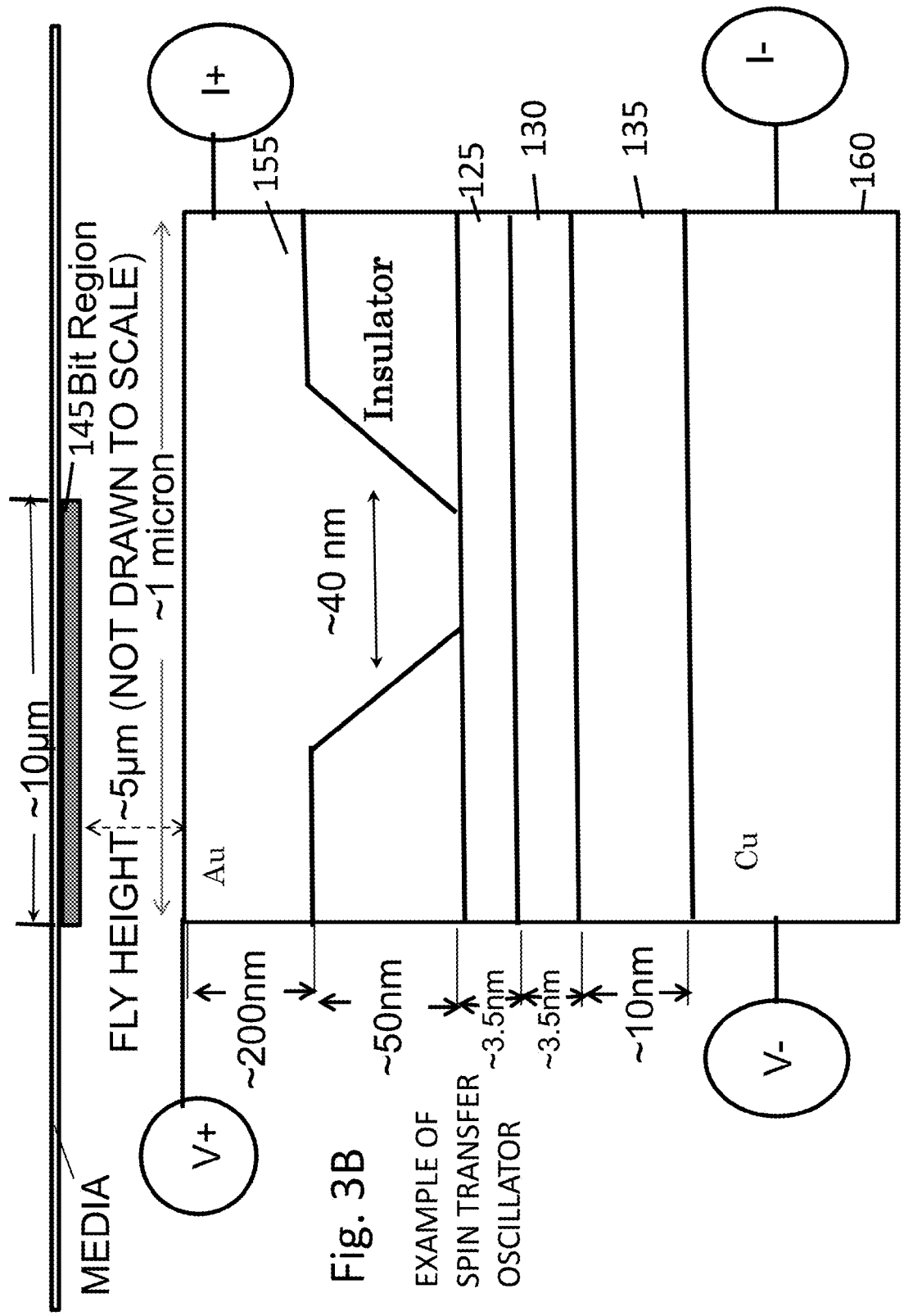

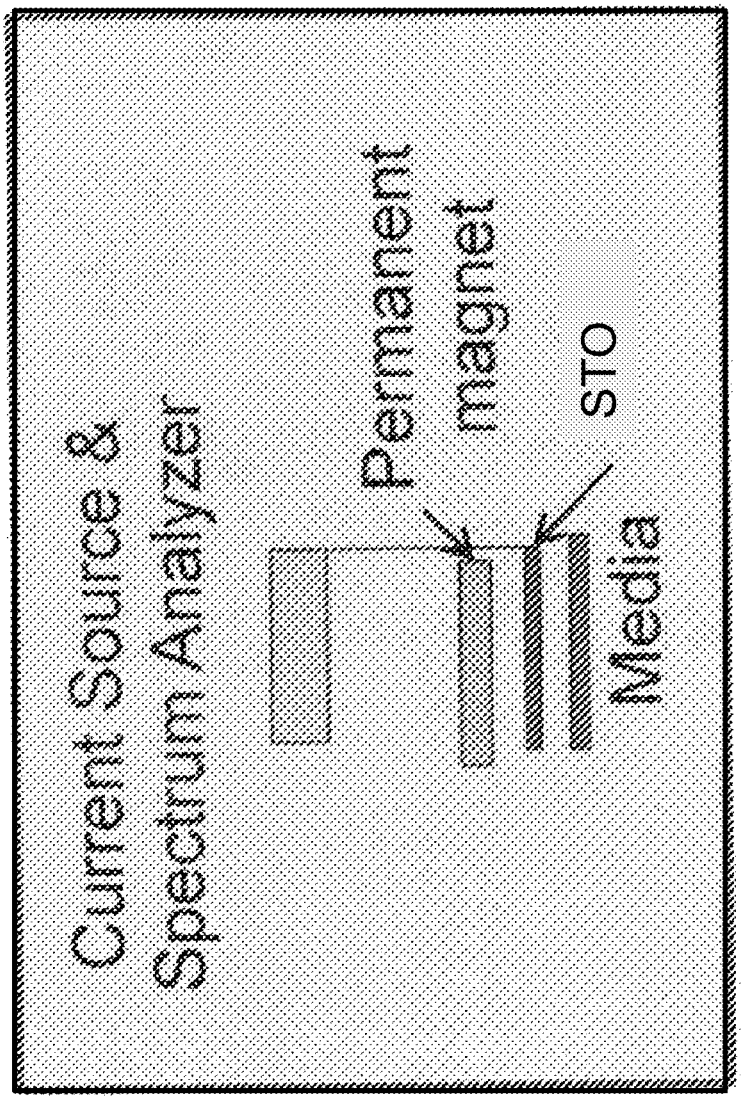
Fig. 3C Schematic of system using a spin transfer oscillator to read magnetic permeability

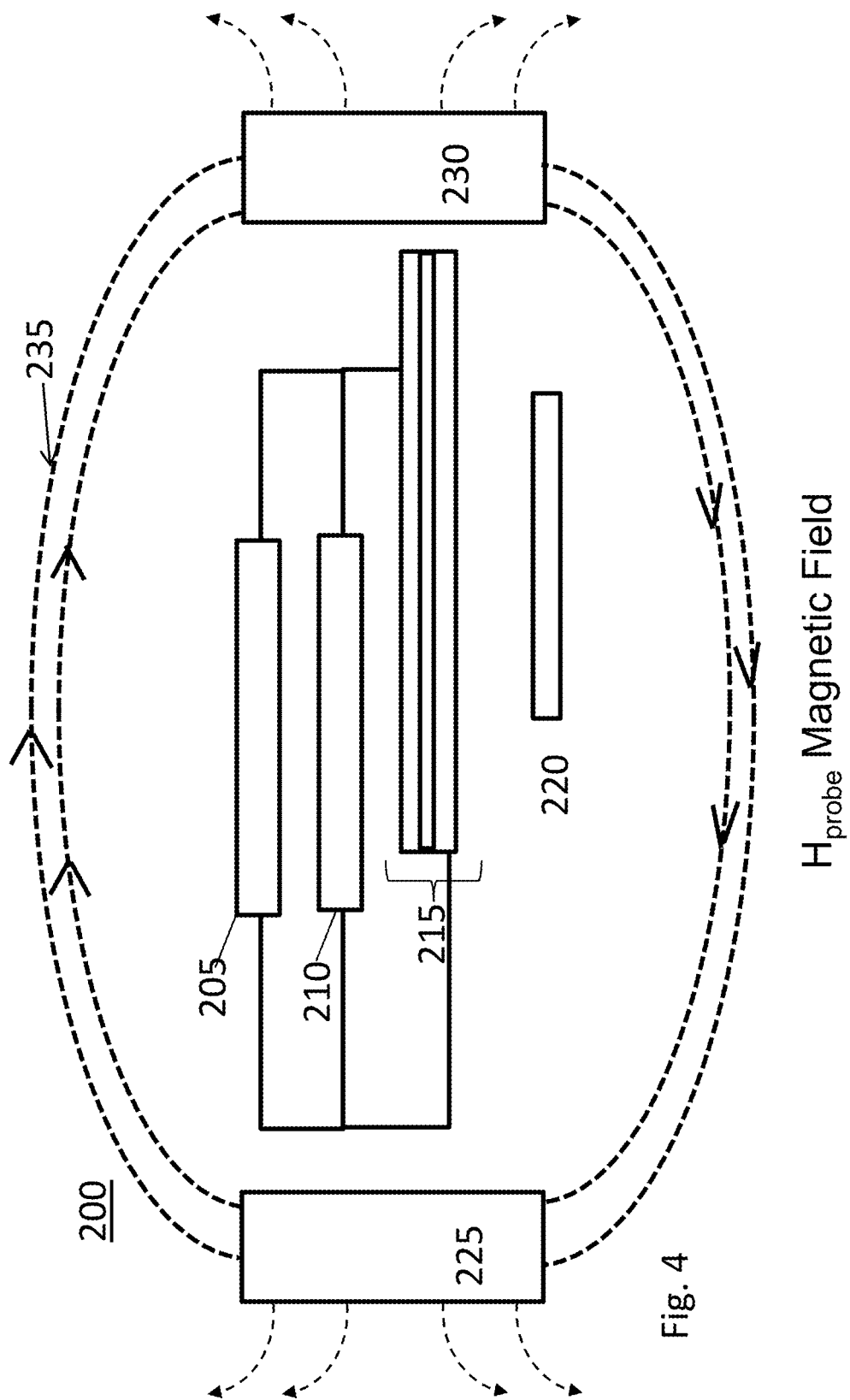

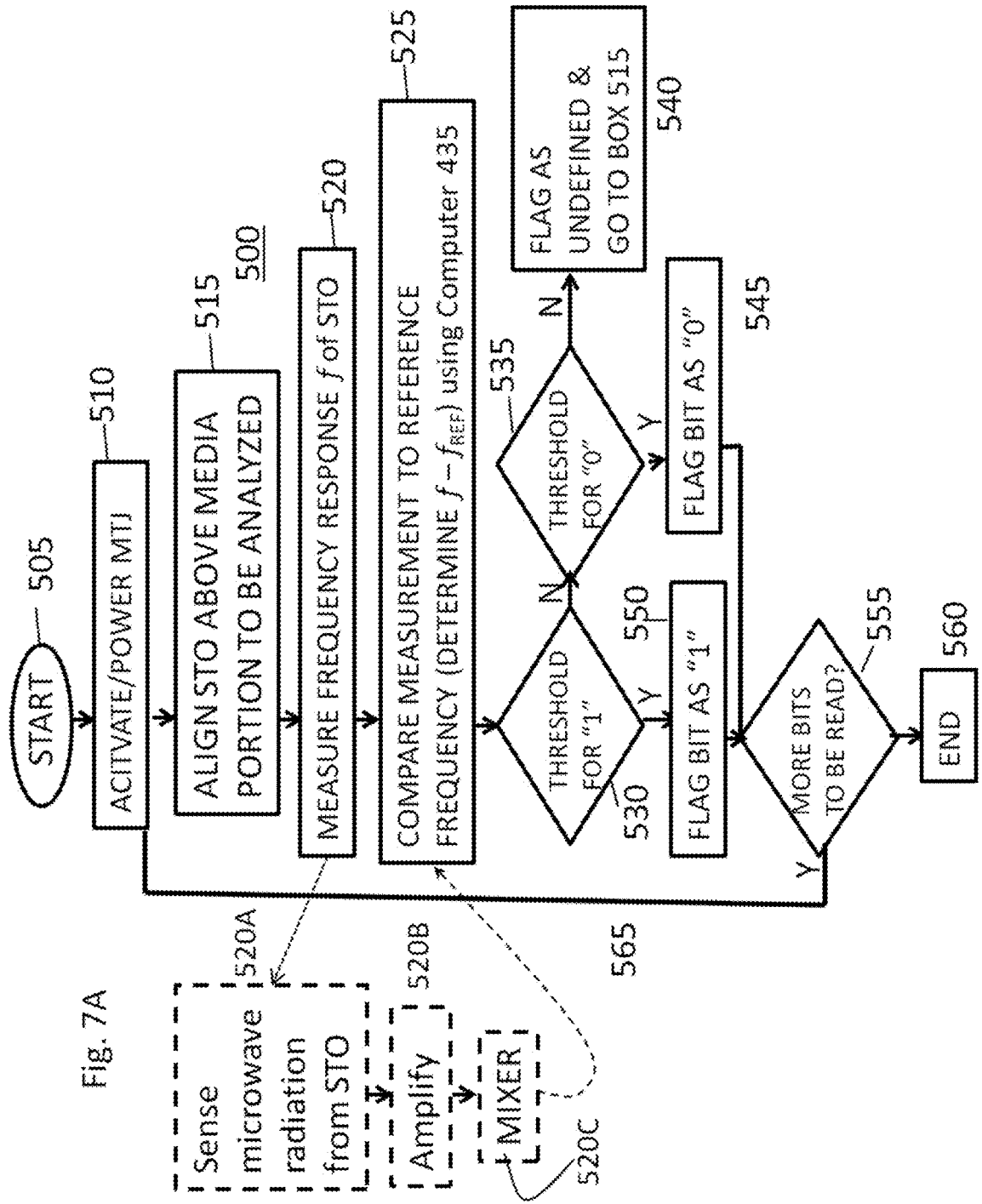

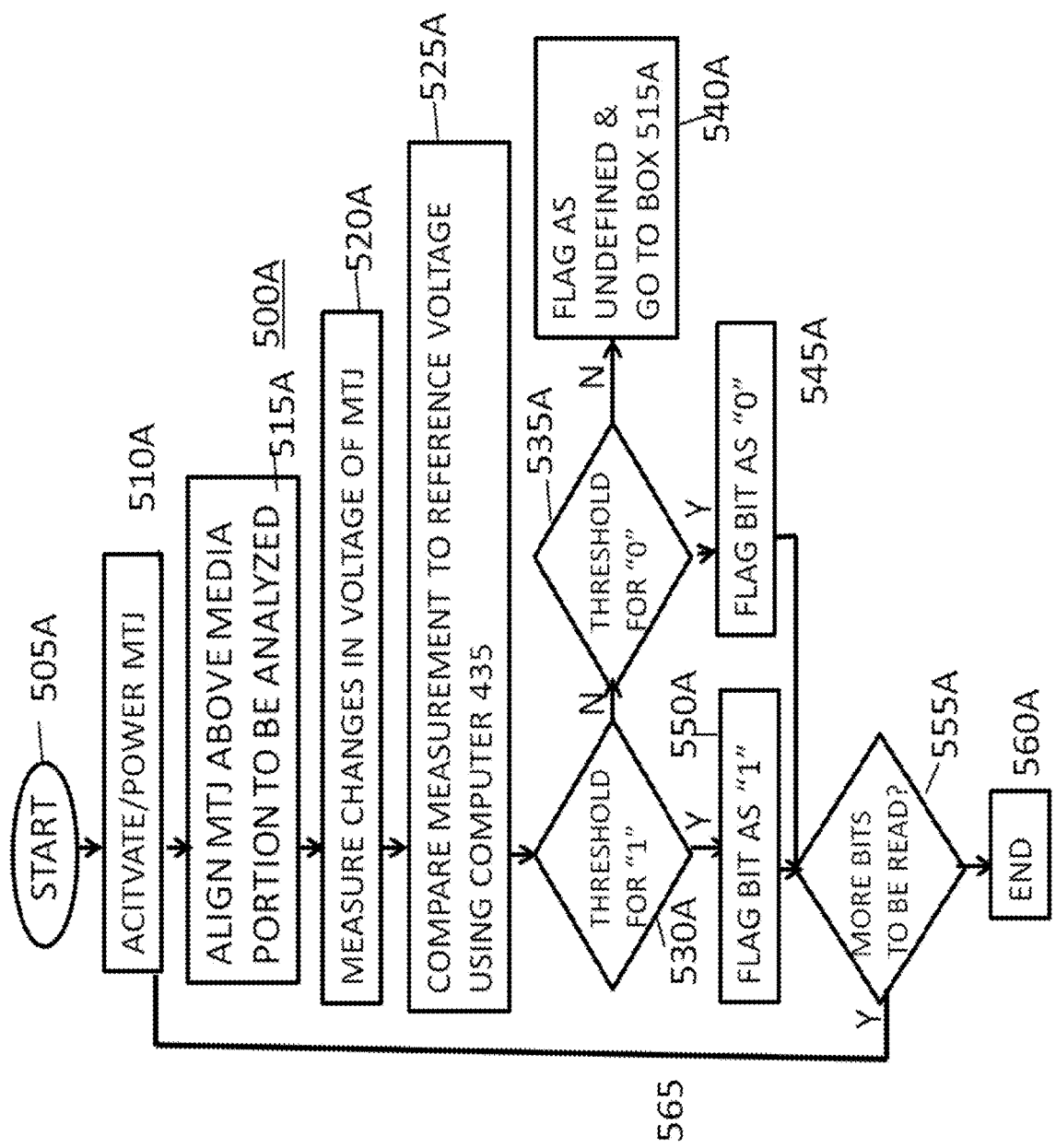

200

IBM™ PART

200 μm

Side view

200

METGLAS

Parallel Writing with Heated Cantilever Array For Marking Metglas

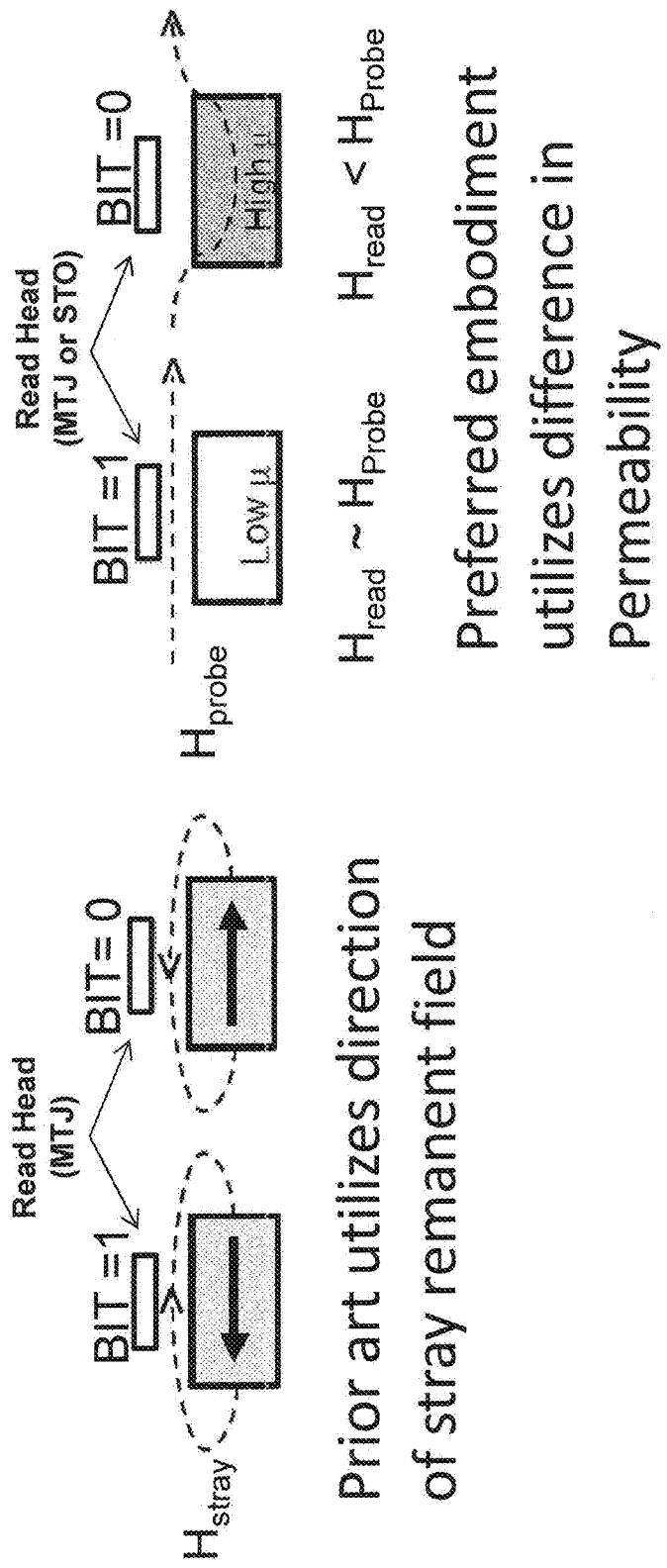

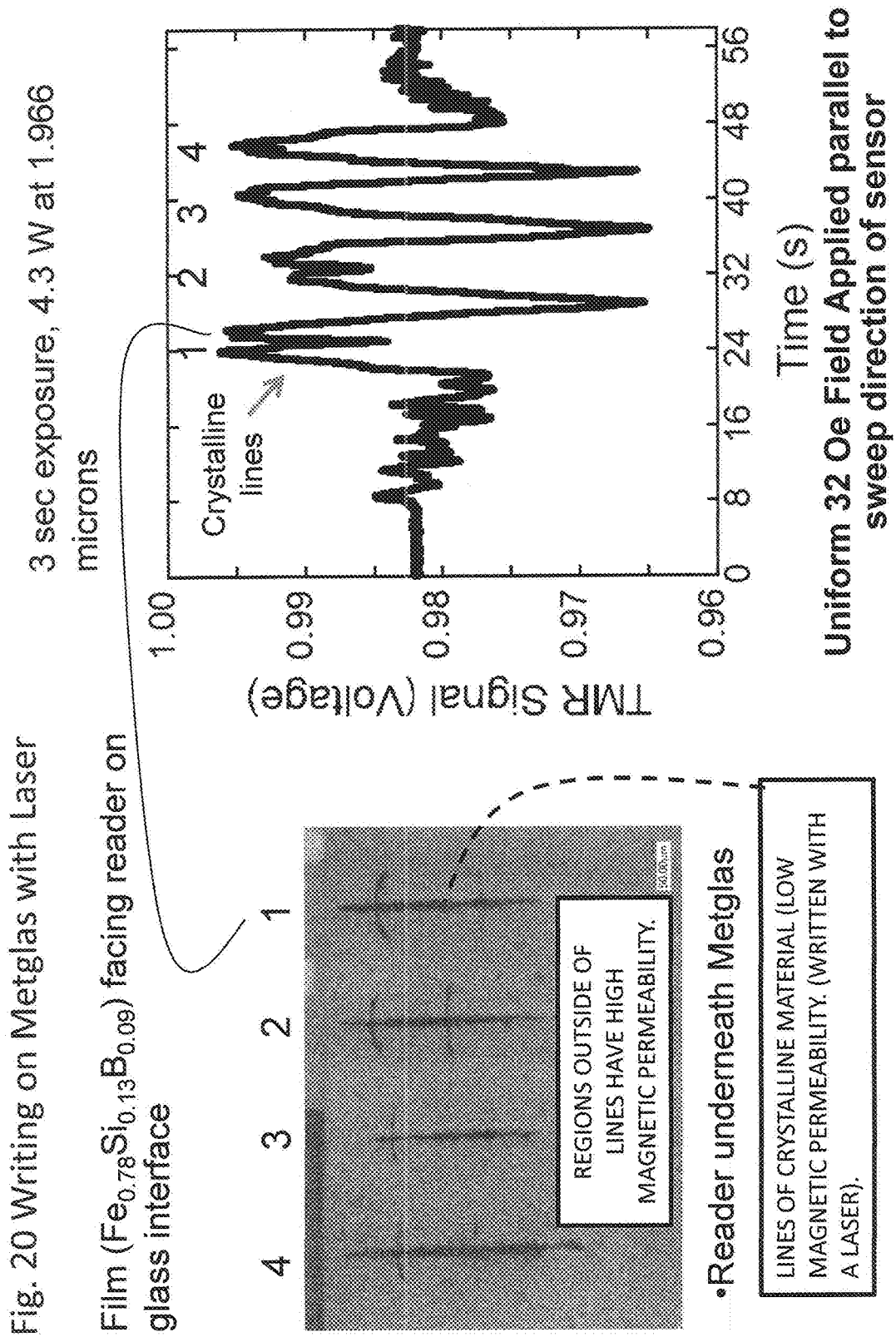
Fig. 20 Writing on Metglas with Laser

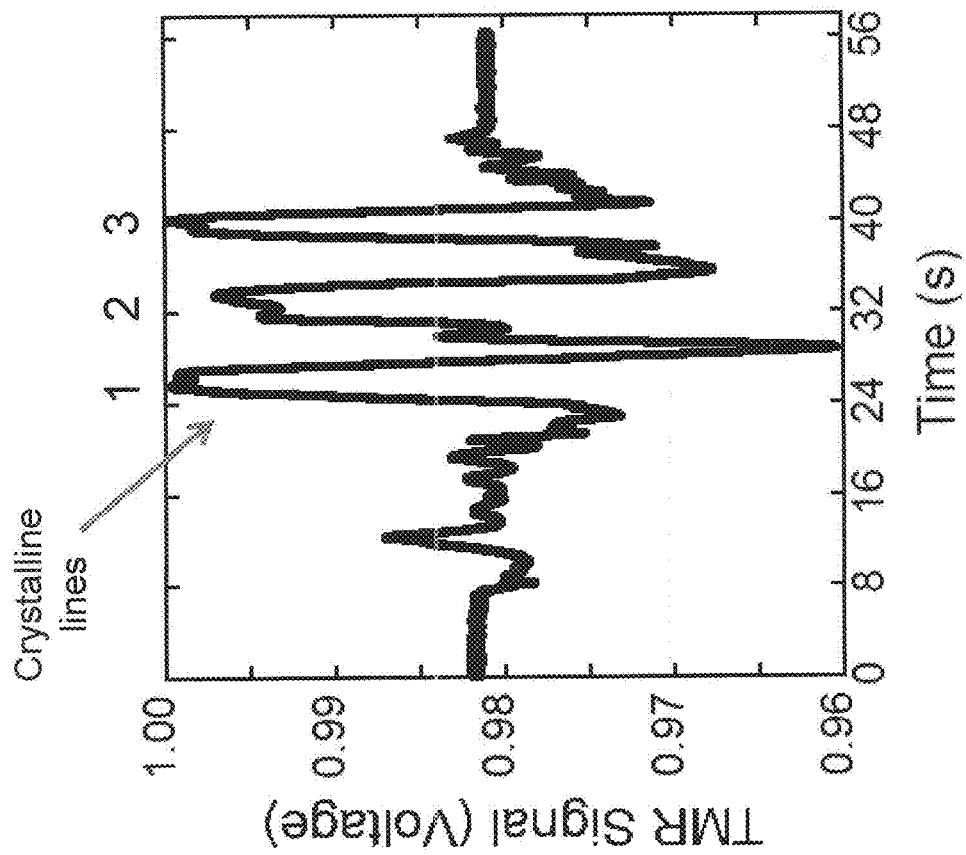
Fig. 21B
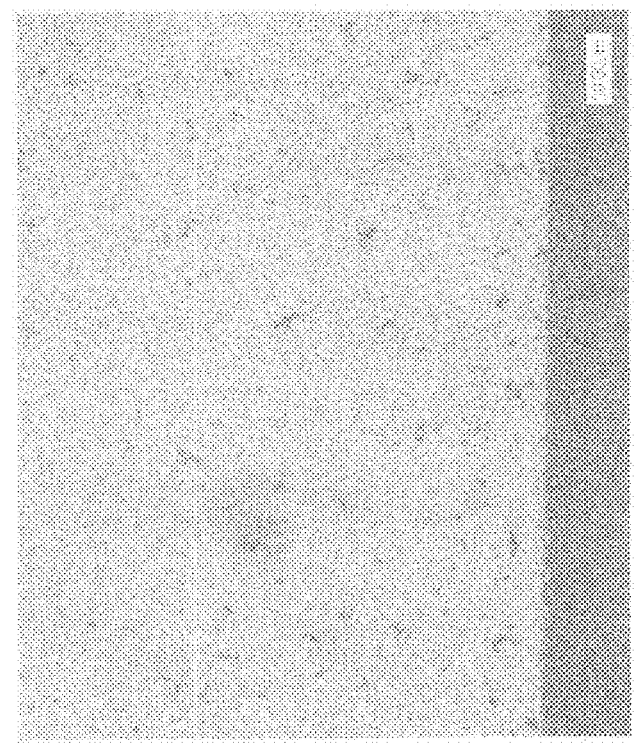
Fig. 21A - Lower Power Exposure: 3 sec (roughly), 2.9 W at 1.966 microns
Film ($Fe_{0.78}Si_{0.13}B_{0.09}$) facing reader on glass interface
No 'burn' marks evident from laser

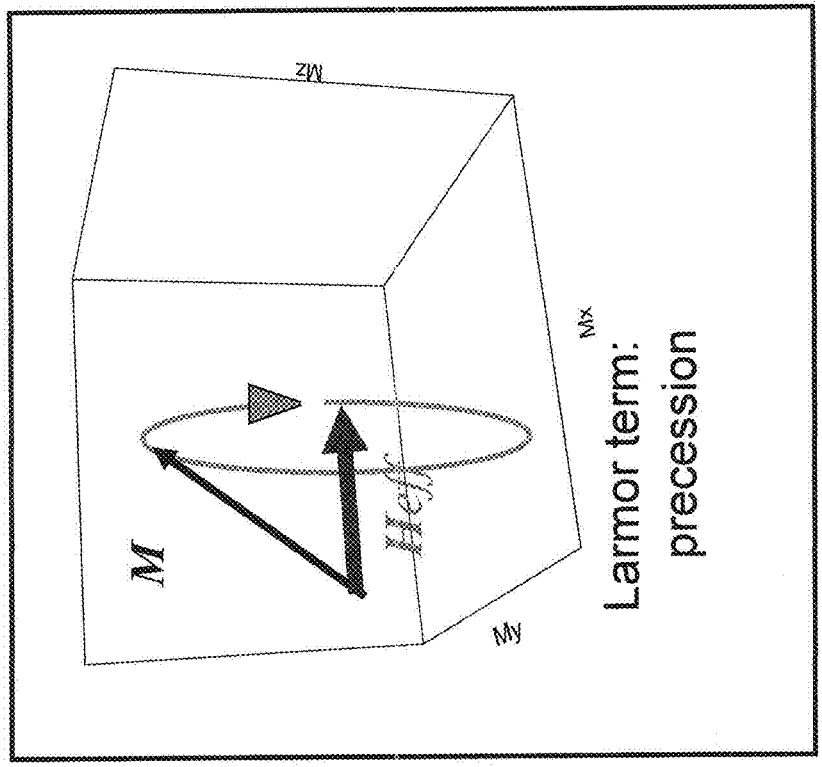
Fig. 22 - Reading High Permeability Bit Using Spin Torque Oscillators (STO)
Radiates at Larmor precession frequency
$$\frac{d\vec{M}}{dt} = \gamma\mu_0 \vec{M} \times \vec{H}_{eff}$$

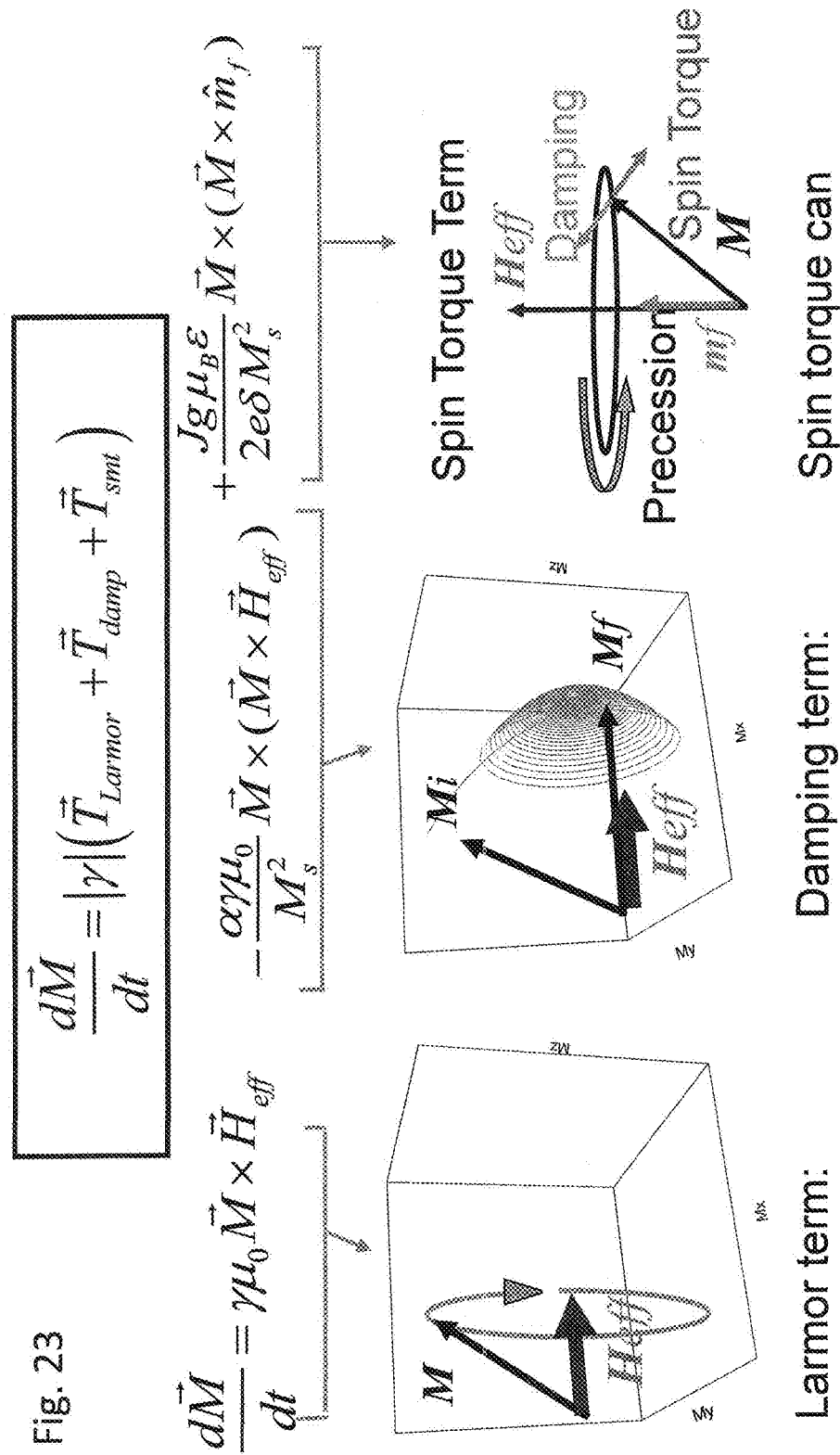

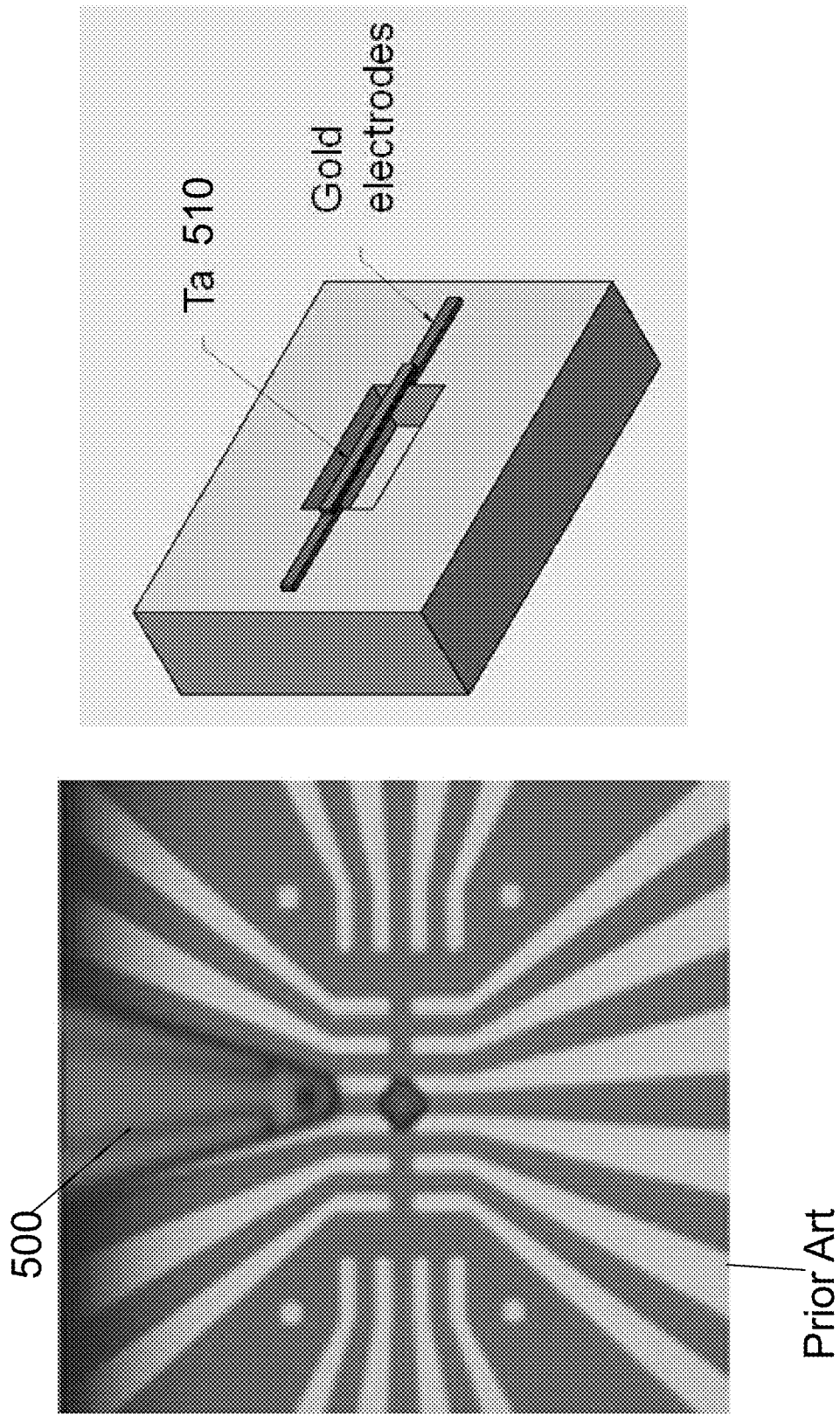
Fig. 24 Alternative Approaches for Writing Submicron Features

NONVOLATILE CORRUPTION RESISTENT MAGNETIC MEMORY AND METHOD THEREOF

CROSS REFERENCE TO RELATED APPLICATIONS

This application claims benefit of U.S. provisional patent application Ser. No. 61/680,834 filed Aug. 8, 2012 which is herein incorporated by reference

STATEMENT OF GOVERNMENT INTEREST

The embodiments herein may be manufactured, used, and/or licensed by or for the United States Government without the payment of royalties thereon.

BACKGROUND OF THE INVENTION

The present invention is directed systems, apparatus and methods for the storage of information.

Magnetic storage has a limited storage lifetime, bit density, and volatility. The magnetic medium used in traditional disk storage degrades within a decade. The information is stored in small magnetic bit regions through magnetizing each region in a particular direction. Over time, the magnetization of the bit regions is corrupted by external electromagnetic forces or through prolonged exposure to the Earth's magnetic field or by thermal upsets. Thermal upsets are statistical processes that occur when the magnetization of a bit is thermally activated to overcome the anisotropy barrier.

As electronic recording evolves and more information is digitized, there exists not just a critical necessity for storage volume but also increased storage permanency. A need exists for high density, stable, non-volatile memory with a longer storage life and less potential to be corrupted by external influences.

FIG. 1 is a schematic diagram of a prior art reader and writer. Information may be erased by exposure to a magnetic field or radiation. Information density/lifetime is limited by the superparmagnetic limit. Storing information for seven years requires: $K_u V/k_B T > 50$ where $K_u$=crystalline anisotropy, V=bit volume, $k_B$=Boltzman constant, and T=absolute temperature. Notably, there is a trade-off between high density and retention time.

SUMMARY OF THE INVENTION

A preferred embodiment of the present invention comprises a system for storing information in a nonvolatile memory comprising a substrate having a magnetic material operatively associated therewith, the magnetic material having at least one first portion of low permeability and at least one second portion of high permeability; a reader comprising a sensor for reading information by measuring the magnetic permeability for the at least one first portion and the at least one second portion; whereby the information contained in at least one first portion and the at least one second portion are not affected by sources of external magnetic energy.

Optionally, the system may comprise a spin torque oscillator (STO) reader which measures the magnetic permeability of the first and second portions by subjecting them to a magnetic field The magnetic field can be an external field (i.e., an external probe field) and/or a magnetic field from the STO. The first and second portions may modify the magnetic field at the position of the STO sensor. The magnetic field at the position of the STO sensor determines the frequency, Q, and/or amplitude of the microwave radiation. Thus, measuring the microwave radiation emitted from the STO determines the magnetic permeability of the first and second portions. Optionally, when the at least one first or second portion are subjected to the magnetic field, they modify the magnetic field at the position of the sensor which in turn determines the properties of the microwave radiation, namely the frequency, Q, and amplitude. The resultant radiation is compared to a reference frequency to determine whether the shift in frequency is sufficient to indicate whether the at least one first or second portion has low permeability or high permeability. Optionally, the resultant radiation is compared to a reference frequency using a mixer and comparator and the frequency of the STO microwave radiation is changed when the STO microwave radiation is effected by the magnetic field change caused by the permeability of at least one first or second portion. The at least one first portion of low permeability may be created by heating the magnetic material with a laser, hot tip, or ohmic heating such that the atomic structure is changed.

Optionally, an alternative system reader may comprise a magnetoresistive sensor (for example a Magnetic Tunnel Junction (MTJ) reader) which measures the change in resistance in a magnetic field. In this case, one measures the resistance change occurring when the sensor passes in close proximity to the at least one first and second portions.

A method of reading information from a magnetic medium based upon the magnetic permeability based upon the principles of the present invention comprises:

aligning a sensor in close proximity to the medium comprising at least one portion of low permeability and at least one portion of high permeability;

measuring the response of the reader when the sensor is in close proximity to the at least one portion of high permeability; the at least one portion of high permeability operating to change the microwave frequency outputted from the reader by more than a predetermined threshold value;

comparing the response to a own reference value; and outputting the information shred in the magnetic medium.

Optionally, the method may utilize a change in the microwave frequency outputted from the reader above a predetermined threshold value when the sensor is in close proximity to determine the permeability.

Alternately, the method may utilize a change in the voltage measured when a magnetoresistive sensor, for example a magnetic tunnel junction reader; with a constant current (flowing through it) is in close proximity to the at least one portion of low permeability. The measurement of voltage ma be compared to a known reference voltage to determine whether the sensor is in close proximity to either a first portion of low permeability or a second portion of high permeability.

Optionally, the method may utilize a reader further comprising at least one permanent magnet or electromagnet positioned in proximity to the sensor that allows the reader to operate in a magnetic field region that maximizes its sensitivity and/or optimizes performance.

Optionally, the method may utilize a magnetoresistive reader and the response of the magnetoresistive reader may be inputted into a difference analyzer for comparing the measurement of voltage to a known predetermined voltage.

Optionally, the method may utilize as a reader a spin torque oscillator that radiates an RF signal which is effected by the first portion or second portion to be measured and wherein a frequency shift is observed, and wherein the effected signal is inputted into a mixer which measures the frequency shift by comparing the frequency of the effected signal with a known reference frequency to determine a difference value which indicates whether the spin torque oscillator is in close proximity to either a first portion of low permeability or a second portion of high permeability, and wherein either a "1" or "0" bit is outputted according to the mixer output. Optionally, the mixer output may be further inputted into a comparator which compares the difference value to a predetermined frequency shift, An alternate embodiment for storing information in a non-volatile memory comprises a medium comprising magnetic material having at least one first portion of low permeability and at least one second portion of high permeability; the portions of low permeability being formed in the medium by heating the portions, such as, for example, by using a laser, with a hot tip, or by ohmic heating.

Other methods of writing include ink jet printing, laser printing, dip pen writing.

BRIEF DESCRIPTION OF THE DRAWINGS

The embodiments herein will be better understood from the following detailed description with reference to the drawings, in which:

FIG. 2A is a schematic diagram of preferred embodiment setup containing microscope 13, media 15, and a single reader 17 in two positions (17A, 17B); in the vicinity of the left position 17A the reader 17 reads '0' and in the vicinity of the right position 17B the reader 17 reads '1'. Calculated (using MAXWELL 3D) probe field lines 11 modified by the soft magnetic permalloy 15 at the '1' position are also shown.

FIG. 2B is a schematic illustration of the view through microscope at 500× magnification of permalloy stripes 15S and Magnetic Tunnel Junction (MTJ) reader chain 17.

FIG. 3B is a schematic illustration of another exemplary preferred embodiment of the present invention using a spin torque oscillator a spectrum analyzer to read magnetic media.

FIG. 3C is a schematic illustration showing the relationship between a magnetic probe field, STO and media.

FIG. 4 is an illustration of an exemplary preferred embodiment of the present invention utilizing an STO with a spectrum analyzer to read magnetic media while applying a magnetic field.

FIG. 7A depicts an exemplary flow diagram to determine bit values of the read media using an STO.

FIG. 7B depicts an exemplary flow diagram to determine bit values of the read media using an MTJ.

The change in TMR increases with increasing w for w<100 microns and with decreasing d between the reader and permalloy for d≤50 microns.

Figure 13:
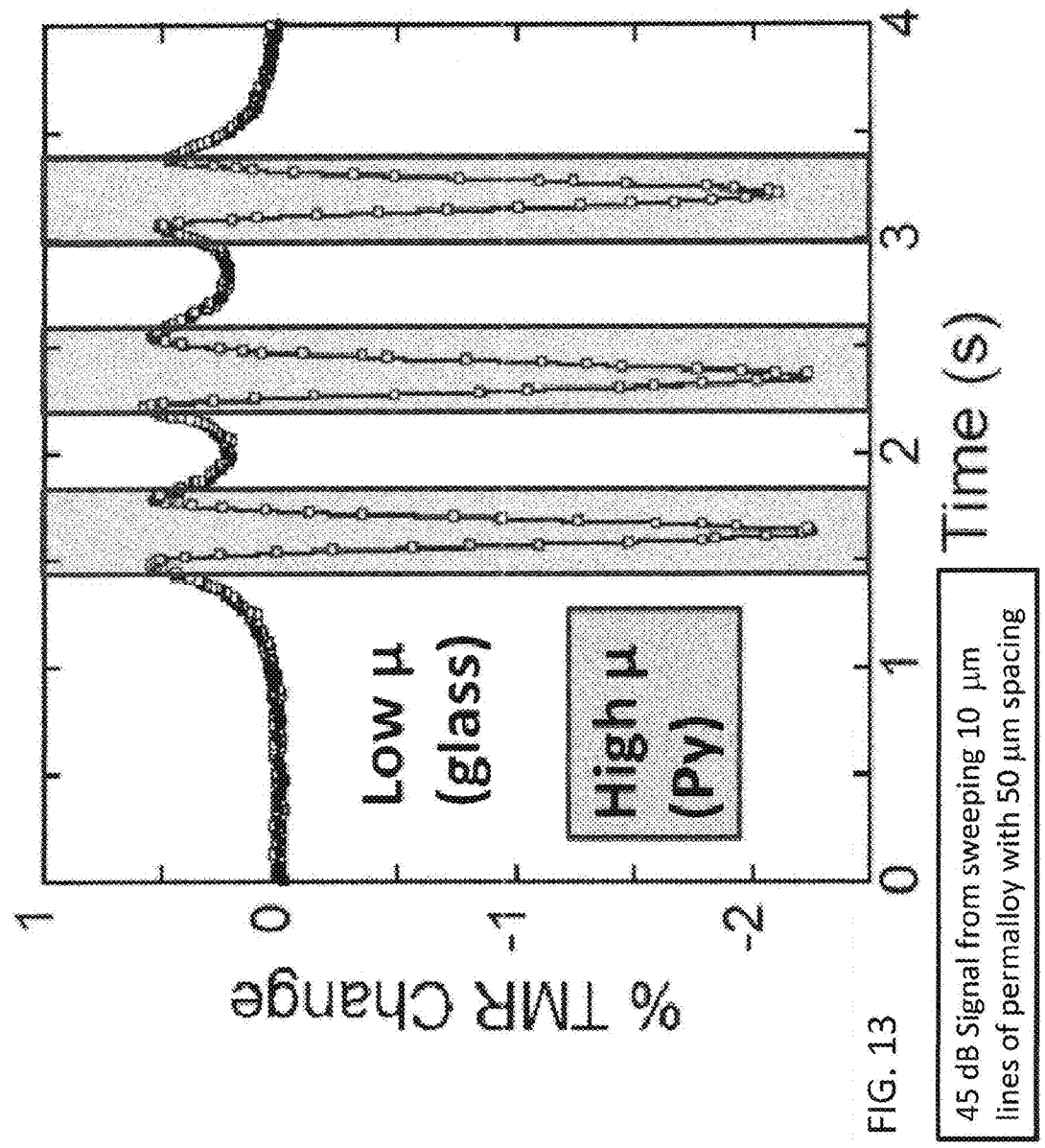

FIG. 13 illustrates the percentage change in TMR resulting from sweeping the reader under three 10 micron wide lines of permalloy, with 50 micron separation between the lines, at a fly height d of 5 microns and a probe field of 32 Oe. Shaded regions indicate the time when reader was swept under the permalloy lines swept over reader. Ten percent of data points are included in the figure.

Figures 14A, 14B:
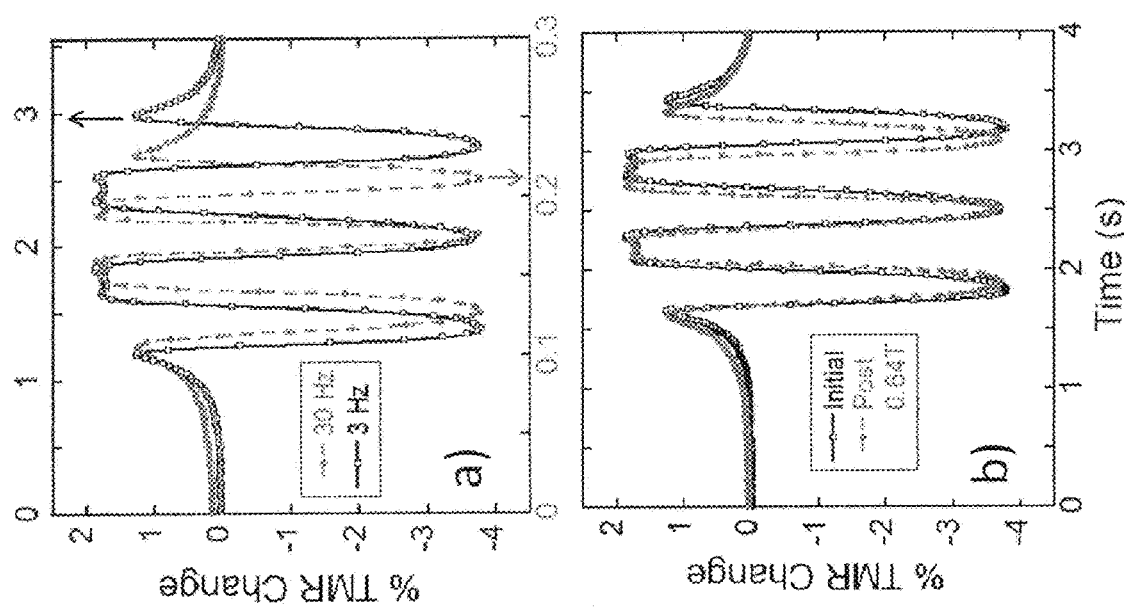

FIG. 14A illustrates graphically the percentage change in TMR resulting from sweeping 50 micron wide lines of permalloy, with 50 micron separation between the lines, at a fly height d of 10 microns, a probe field of 32 Oe, and at either a 3 or 30 Hz reading rate. Ten percent of data points are included in the figures and the sweeps are slightly offset on the time axis for clarity.

FIG. 14B illustrates graphically the percentage change in TMR resulting from sweeping the reader under the 50 micron wide lines of permalloy, with 50 micron separation between the lines, at a fly height d of 10 microns, a probe field of 32 Oe, and at 3 Hz before and after a 60 second exposure to a 6400 Oe field. Ten percent of data points are included in the figures and the sweeps are slightly offset on the time axis for clarity.

FIG. 15 is a schematic comparison of current reading technology to that of a preferred embodiment of the present invention (shown to the right)

Figure 16:
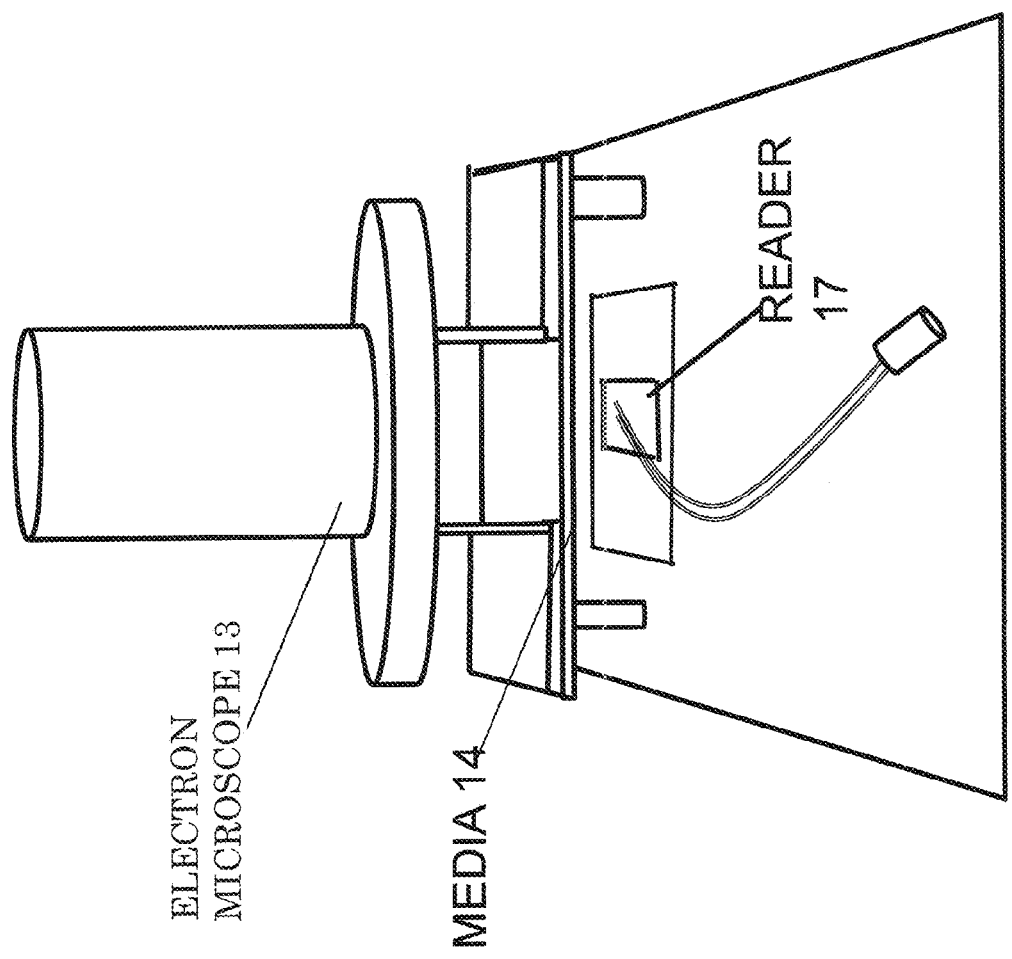

FIG. 16 is a schematic illustration depicting an electron microscope 13 having a media or glass 14 upon which permalloy is deposited and read by reader 17 as described above.

Figure 17:
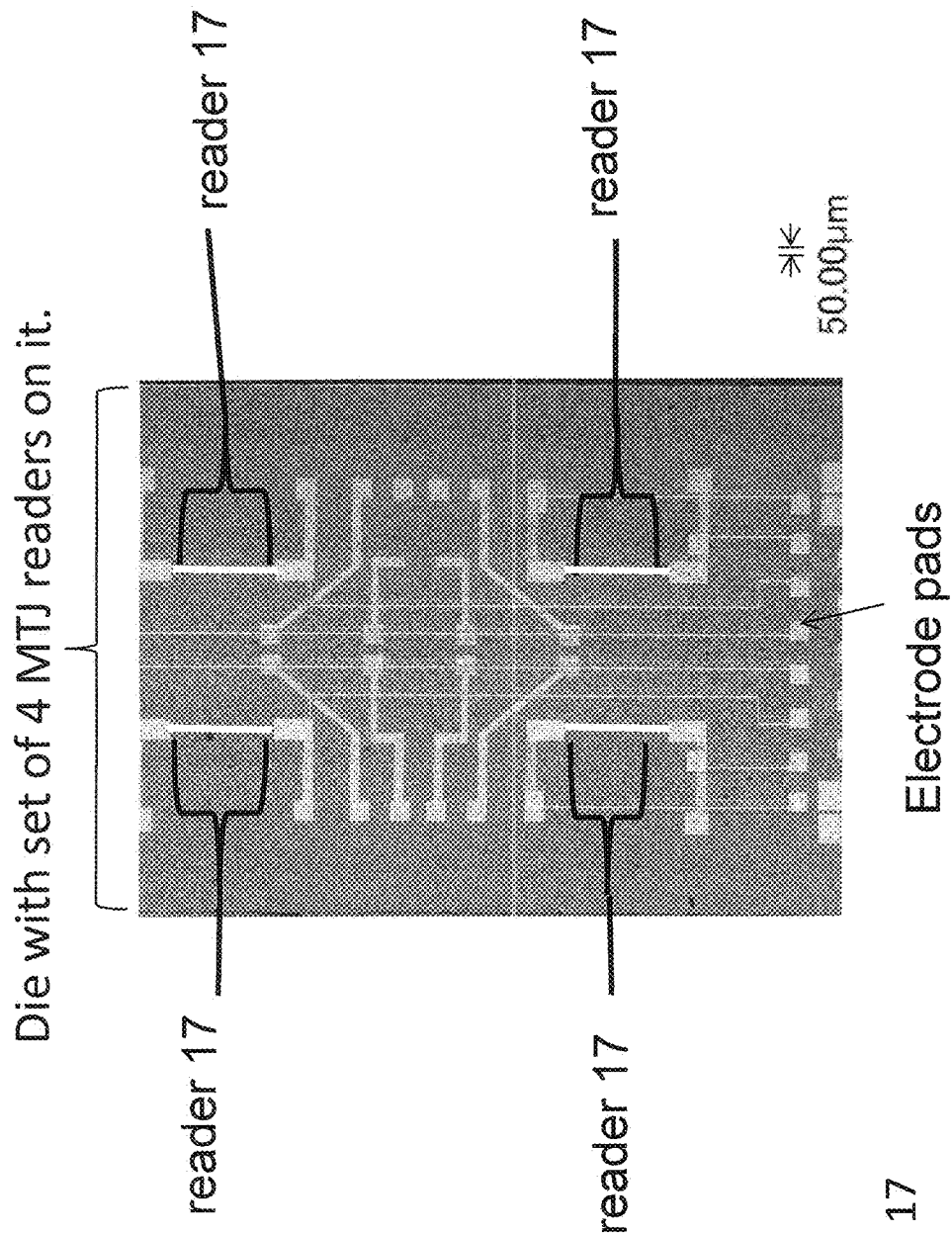

FIG. 17 shows a die with a set of 4 MTJ readers 17 thereon. Electrode leads run to one side of die (bottom in picture) so as to not effect wire bonding to electrode pads.

Figure 18:
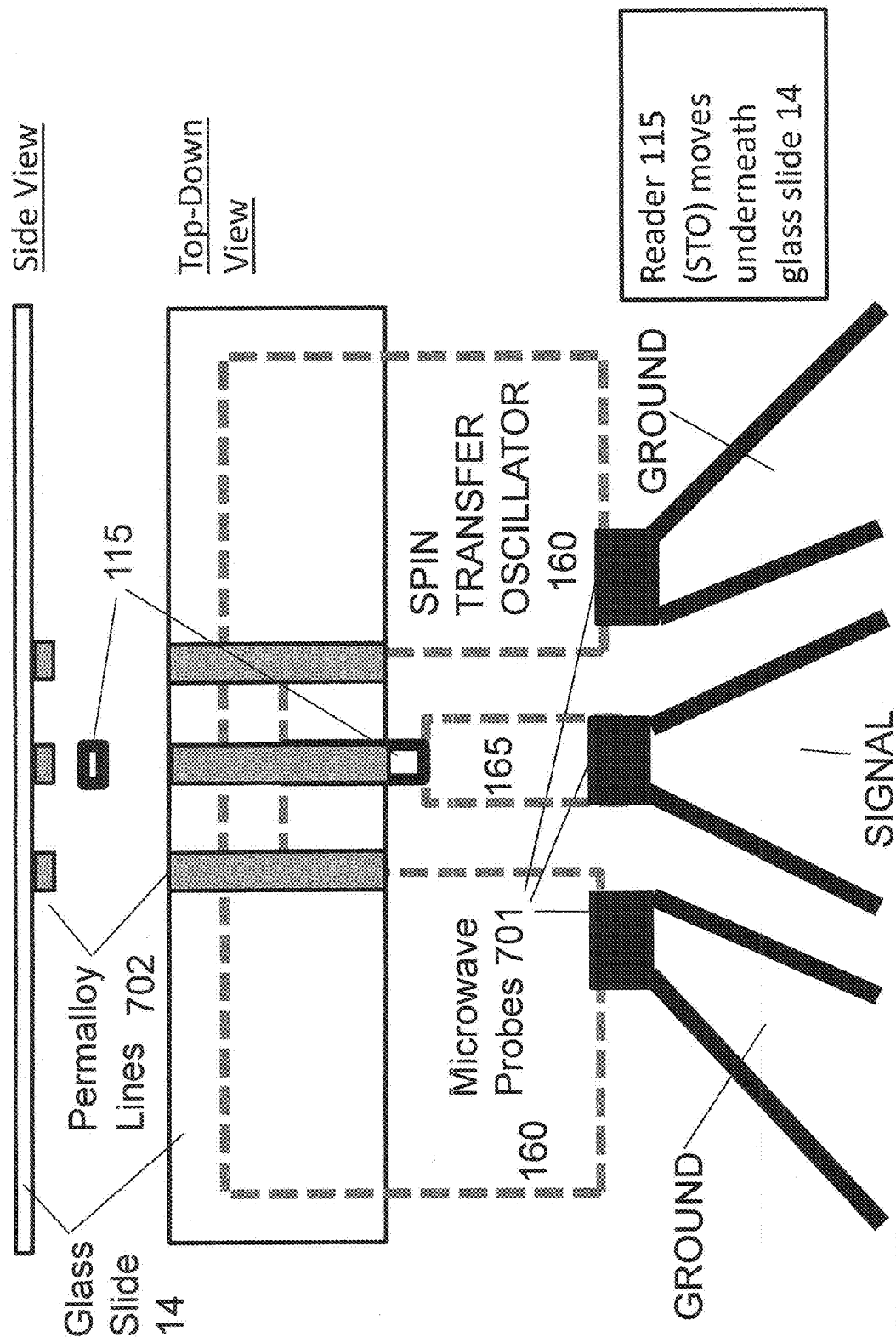

FIG. 18 is a schematic illustration of an STO, microwave probes and permalloy lines.

Figure 19:
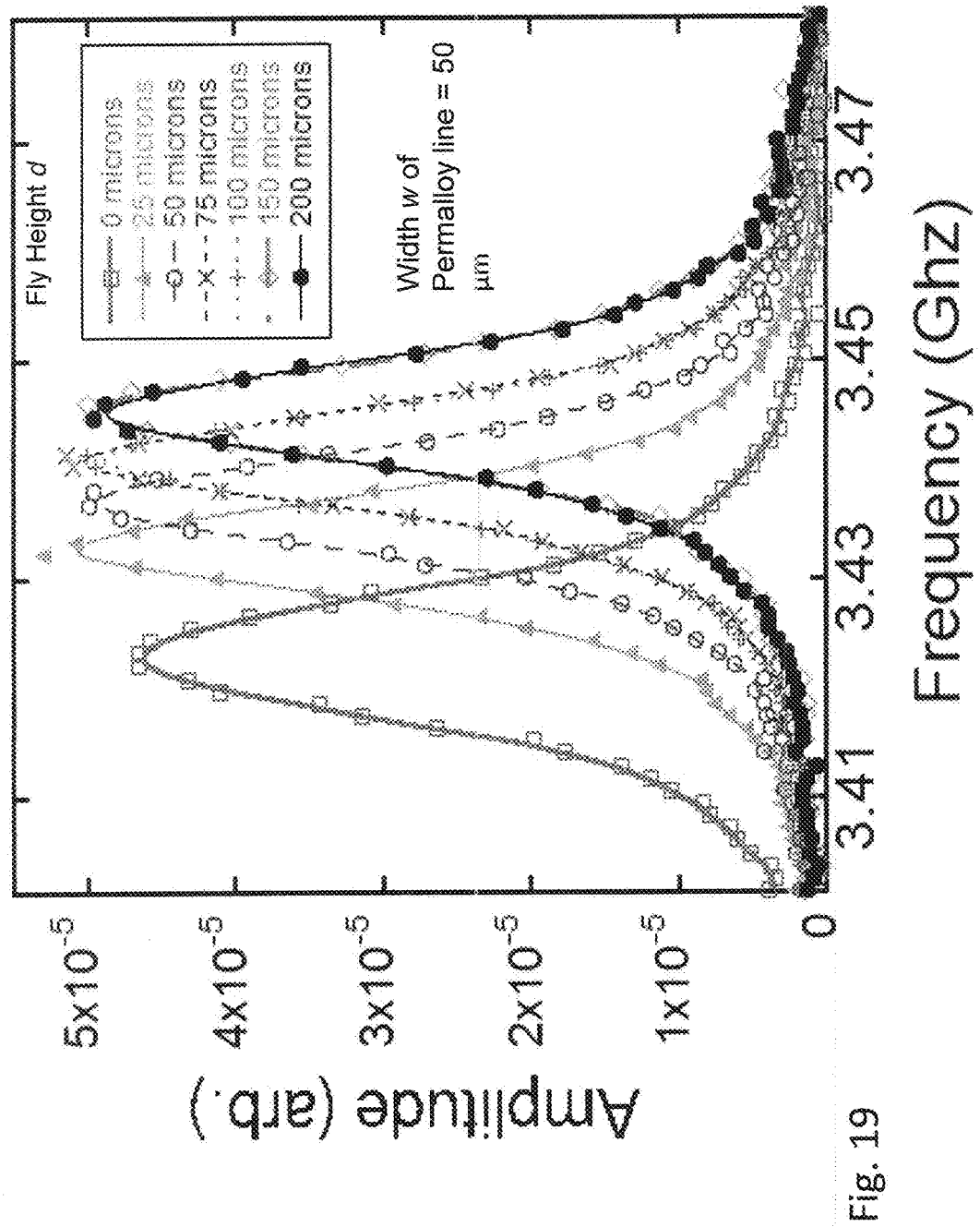

FIG. 19 is a graphical illustration showing STO response (microwave frequency) as a function of frequency for different fly heights of a 50 micron wide permalloy line.

FIG. 20 Illustrates writing on Metglas with 4.3 W, 3 sec laser pulses with the regions outside of the laser writing have high magnetic permeability and the lines of crystalline material resulting from the laser heating have low permeability. Shown to the right of FIG. 20 are the results of the reading of the low permeability lines shown in the left portion of this figure written by laser heating.

FIG. 21A illustrates writing on Metglas with 2.9 W 3 sec laser pulses with the regions outside of the laser writing have high magnetic permeability and the lines of crystalline material resulting from the laser heating have low permeability.

FIG. 21B illustrates the reading of the low permeability lines shown in FIG. 21A written by laser heating.

FIG. 22 diagrammatically illustrates the precession of the magnetization of the free layer in an STO.

FIG. 23 diagrammatically illustrates how the magnetization changes in time. One of the factors affecting the magnetization is the torque provided by the spin polarized current. This torque can balances the relaxation torque so that the magnetization precesses in a spin torque oscillators (STO) as postulated by Slonczewski in 1996.

FIG. 24 illustrates alternative writing approaches utilizing the principles of the present invention.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skilled in the art to practice the embodiments of the invention. Accordingly, the examples should not be construed as limiting the scope of the embodiments of the invention.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

A preferred methodology for reading media in a non-erasable (or nonvolatile) memory technology is based on bits of high and low magnetic permeability. Since the permeability is an intrinsic property, this technology can potentially encode information at higher densities and with longer retention times than present magnetic storage based on spin domains. To illustrate the preferred embodiment technique, 10 micron wide magnetic tunnel junctions (MTJs) are used to read approximate 10 micron wide lines, with approximate 50 micron separation, of a soft magnetic material, permalloy, deposited on low permeability glass, as depicted in FIG. 2B. The dimensions may be modified without departing from the scope of the present invention. A magnetic probe field is unaffected by the glass but is shunted away from the MTJs by the higher permeability permalloy lines. The difference in field sensed by the MTJs has a signal-to-noise ratio of 45 dB that persists at different scan rates and even after the lines are exposed to fields of 6400 Oe. The information density is expected to be able to be increased by decreasing the size of the magnetic tunnel junctions.

Current magnetic memory technology that manipulates an extrinsic property of magnetic media, e.g., the direction of magnetization (as shown in FIG. 15), to encode information has two major disadvantages for data storage. First, since the information is written by applying a magnetic field to switch the spin direction, the information can also be erased by exposure to an inadvertent magnetic field. Secondly, the density and lifetime of the bits are restricted by the need to preserve thermal stability of the magnetic domains. Thermal stability of the domains is constrained by the superparamagnetic limit, as described in greater detail in Y. Zhimin, et al., in Magnetic Recording Conference, 2009. APMRC '09. Asia-Pacific. 2009 and R. F. L. Evans, Applied Physics Letters, 2012. 100 (10): p. 102402-3. For example, to reliably store information at room temperature for 7 years, domain sizes above 5-50 nm are required to satisfy the Néel-Arrhenius relation $K_u V/k_B T > 50$, where V is the volume of the bit, $K_u$ is the crystalline anisotropy, $k_B$ is the Boltzmann constant, and T is the absolute temperature. Alternative methods of information storage do not presently possess the density of magnetic memory and generally do not retain information indefinitely. Thus, each year billions of dollars worldwide must be spent duplicating huge amounts of data to prevent corruption by thermal upsets or accidental exposure to magnetic fields. To improve the ability to store information, a preferred embodiment technology stores information by using an intrinsic property of soft ferromagnetic materials, the magnetic permeability. The presence of high (low) permeability material modifies (does not affect) an external "probe" magnetic field. Any magnetic field modification is detected by a reader in close proximity to the media, which consists of regions of different permeability, as described in greater detail in U.S. Published Application No. 2008/0102320, by A. S. Edelstein and G. A. Fischer, entitled "Non-Erasable Magnetic Identification Media," hereby incorporated by reference. The media is non-erasable, as the magnetization of a soft ferromagnet returns to its original demagnetized state when the probe magnetic field is removed. Since the magnetic permeability is an intrinsic property dependent on the atomic arrangement of the media, it is insensitive to external influences (e.g., electromagnetic radiation and temperature) and should maintain an indefinitely long retention time under typical environmental conditions. Furthermore, there is no theoretical limit on the density that is equivalent to the restriction of the superparamagnetic limit. The limitation, instead, is the practical requirement of finding an economical method for reading and writing the information.

In accordance with the principles of the invention, a preferred embodiment system comprises a soft magnetic media with a series of magnetic tunnel junctions (MTJs) acting as the reader. See for example, FIG. 2B. In contrast to present magnetic memory technology, in which the media provides the field detected by the reader, our technology decouples the process. Instead, in general in a preferred embodiment an external magnet or coil provides a "probe" magnetic field and the soft magnetic media modifies this field. Thus, for optimization, the magnetic field and media can be separately selected to optimize performance. Different widths of high permeability permalloy lines, which may, for example, be 0.434 microns thick and 2500 microns long, may be sputtered onto a 1200 micron thick optical grade soda lime substrate of low permeability ($\mu_r \sim 1$) or other low permeability substrate. These lines consist of six alternating layers of 70 nm permalloy ($Ni_{80}Fe_{20}$) and 2.25 nm Cr. The layers can be sputtered in a magnetron sputtering system, with a working Ar gas pressure under 10 mtorr and a bias of −100 V at the substrate. These conditions reduce intrinsic stress in the thin film and result in low coercivities (~0.1 Oe) and high permeabilities ($\mu_r \sim 1000$). E-beam lithography was employed to pattern the lines on the glass. The experimental setup for reading is shown in FIGS. 2A and 16. A probe field is either unchanged by the glass 14 or modified by the permeability of the permalloy 15. The modified field in FIG. 2A is read as either a '0' or '1' bit by the MTJs in the reader 17. As depicted in FIG. 2A, the permalloy bits 15 shunt some of the field into the permalloy. Depending upon the geometry this can either increase or decrease the field at the position of the reader 17, Shown in FIG. 2A is the case in which the detected field is decreased in magnitude at the '1' position. The reader is placed on the movable stage of a microscope 13, which may be for example, a VHX-1000 Keyence. A permanent magnet attached to the moveable stage provides a probe field oriented along the sense direction of the MTJs in the reader. The media (comprising glass 14) is held parallel to the plane of the reader and is located between it and the lens of the microscope. The separation between the media 14 and the reader 17, defined as the fly height, can be varied between 0 and 100 microns. A schematic view of the media and reader, as seen through the microscope at a magnification of 500, is shown in FIG. 2B. At a constant fly height, the moveable stage was used to manually translate the reader under the stationary media. The preferred embodiment method of measurement has the advantage that one can visually correlate positions of the reader and media to changes in the detected field due to the media's permeability.

The changes in field were determined by the tunneling magnetoresistance (TMR) in the MTJs at a constant current of 1 mA and a sampling rate of 1000 Hz. There are 10 serially connected 40×10 micron MTJ ellipses in the reader. The magnetic sense direction of these MTJs is perpendicular to their major axis, which is in the same direction as the MTJ chain. MTJ stacks were deposited onto a thermally oxidized silicon substrate in a magnetron sputtering system with a base pressure below 1 microtorr. Each MTJ 115 shown in FIG. 3 comprised nm-thick layers of Ta(5)/Ru(20)/IrMn(5)/ $Co_{50}Fe_{50}(4)$/Ru(0.8)/$Co_{40}Fe_{40}B_{20}$(3.5)/MgO(2)/ $Co_{20}Fe_{60}B_{20}$(1.8)/NiFeCuMo(50)/Cu(10). The two layers immediately above the MgO insulator 130 comprise the free layer 125, and electrode 155. There are three layers (not shown) below fixed layer 135 that constitute the synthetic antiferromagnetic (SAF) reference layer that is used to pin the direction of the magnetization in the fixed layer. See in this regard S. H. Liou, et al., Magnetics, IEEE Transactions on, 2011. 47 (10): p. 3740-3743, hereby incorporated by reference.

Figure 11:
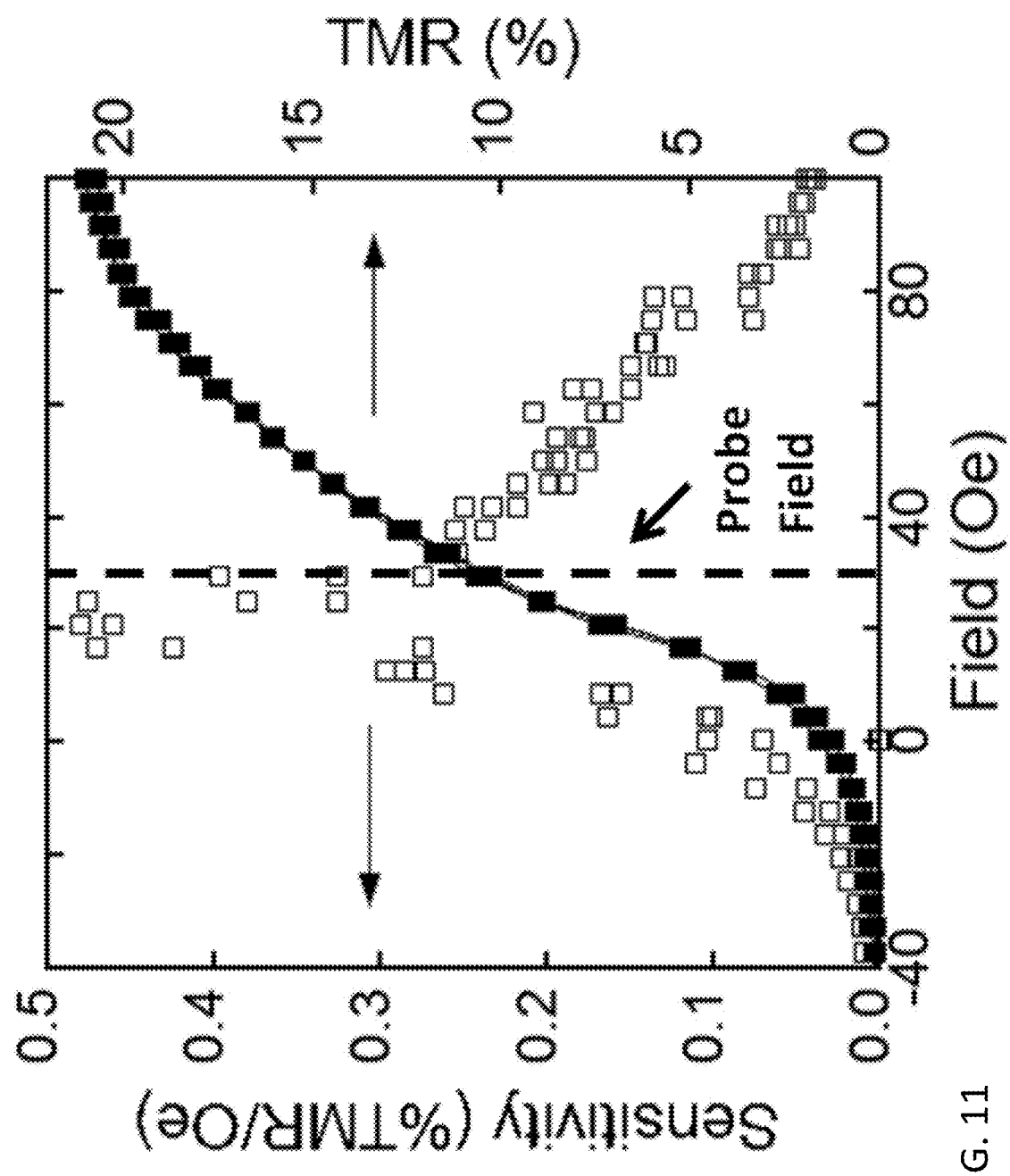
FIG. 11 is an illustration showing the percentage TMR change (ΔTMR) and Sensitivity of a magnetic tunnel junction as a function of the magnetic field.

As seen in FIG. 11, the reader MTJ chain 17, for example, has a maximum TMR of 22% and a maximum sensitivity of 0.48%/Oe in a field of 22 Oe. The reason that the maximum sensitivity is shifted from zero field has been attributed to roughness of the films and edge effects on each MTJ giving rise to stray fields from the reference layer, as described further in S. Ikeda, J, et al., Electron Devices, IEEE Transactions on, 2007. 54(5): p. 991-1002. The permanent magnet provides a probe field of 32 Oe in the sense direction of each MTJ in the chain 17, which results in a TMR of 11% and sensitivity of 0.32%/Oe with no media present.

Referring again to FIG. 3, shown in block diagram form is an illustration of an exemplary embodiment of the present invention using a spin torque oscillator and a spectrum analyzer to read magnetic media. A reader 100 comprises a magnetic field source (not shown), a constant current source 105, spectrum analyzer 110, spin torque oscillator (STO) 115, and magnetic media 120. The constant current source 105, spectrum analyzer 110, and STO 115 are electrically connected in parallel. Permeable material changes the effective field at the position of the sensor which then changes the precession frequency of the STO. The precession frequency is measured as a microwave voltage by the spectrum analyzer.

According to Wikipedia, the spin-transfer torque is an effect in which the orientation of a magnetic layer in a magnetic tunnel junction or spin valve can be modified using a spin-polarized current. Charge carriers (such as electrons) have a property known as spin which is a small, unique quantity of angular momentum intrinsic to the carrier. An electrical current is generally unpolarized (consisting of 50% spin-up and 50% spin-down electrons); a spin polarized current is one with more electrons of either spin. By passing a current through a thick magnetic layer, one can produce a spin-polarized current. If a spin-polarized current is directed into a magnetic layer, angular momentum can be transferred to the layer, changing its orientation. This can be used to excite oscillations or even flip the orientation of the magnet. The effects are usually only seen in nanometer scale devices. Spin transfer torque is illustrated in FIG. 23. Further according to Wikipedia, spin-transfer torque can be used to flip the active elements in the conventional magnetic random-access memory. Spin-transfer torque random-access memory, or STT-RAM, has the advantages of lower power consumption and better scalability over conventional magnetoresistive random-access memory (MRAM) which uses magnetic fields to flip the active elements. Spin-transfer torque technology has the potential to make possible MRAM devices combining low current requirements and reduced cost.

Unlike conventional memory construction, the preferred embodiment of the present invention utilizes the property of magnetic permeability to distinguish binary bits. The bits are read with a spin transfer oscillator that uses spin transfer torque to balance the effect of damping or read with some other magnetic sensor.

Figure 1:
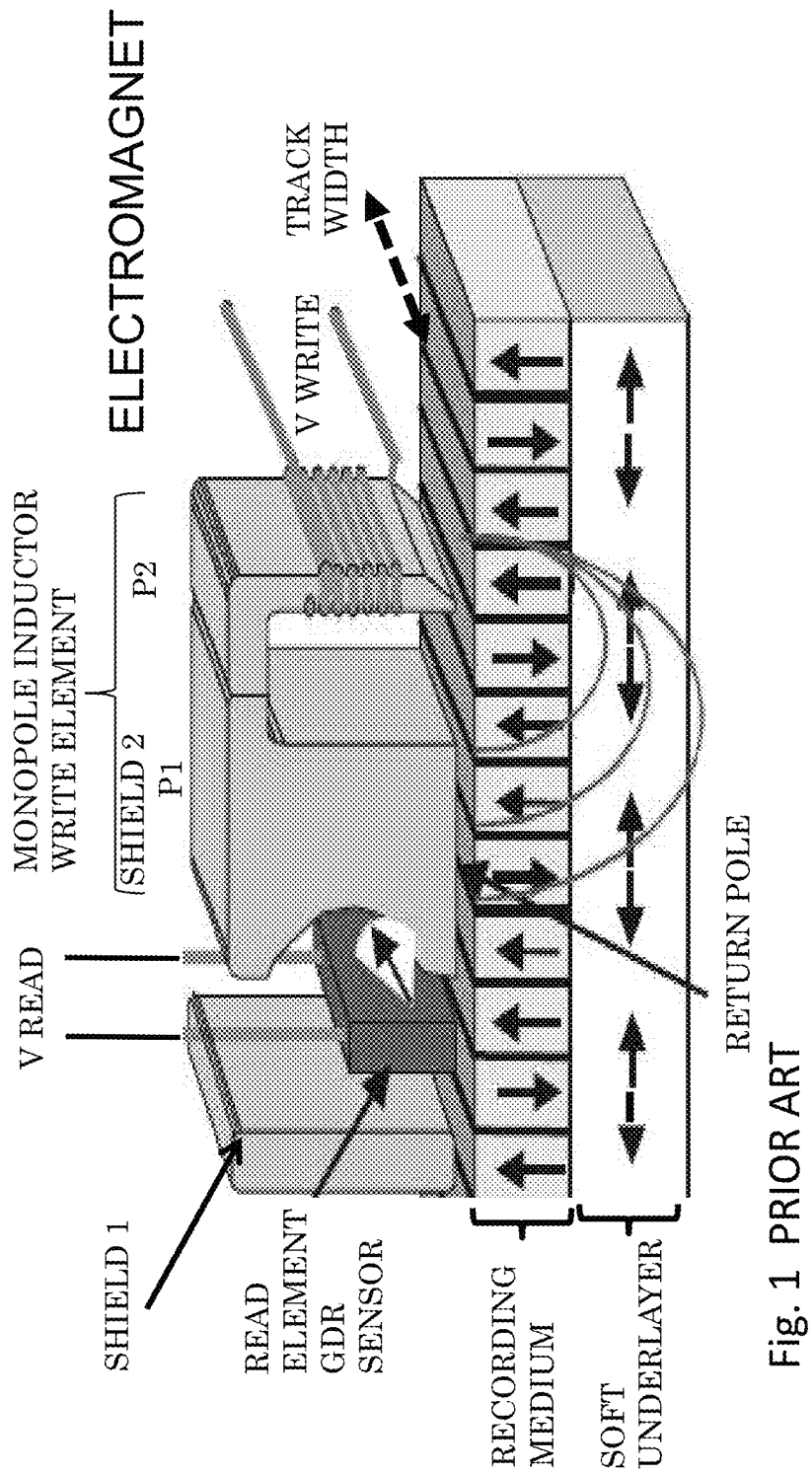
FIG. 1 is a schematic illustration of a prior art magnetic reader and writer set up.
Figure 3A:
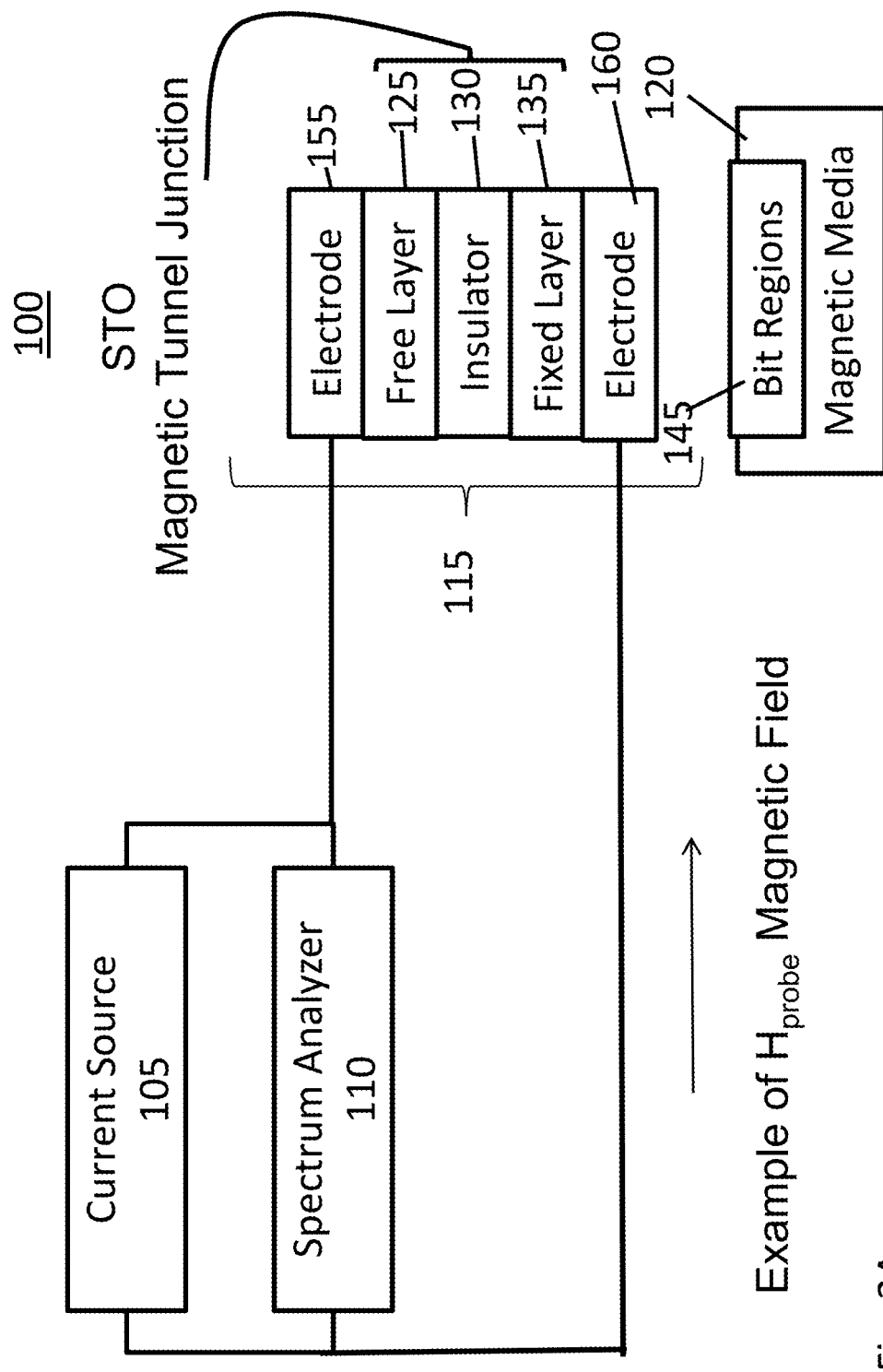
FIG. 3A is a schematic illustration of an exemplary preferred embodiment of the present invention using a spin torque oscillator a spectrum analyzer to read magnetic media.
Figure 9:
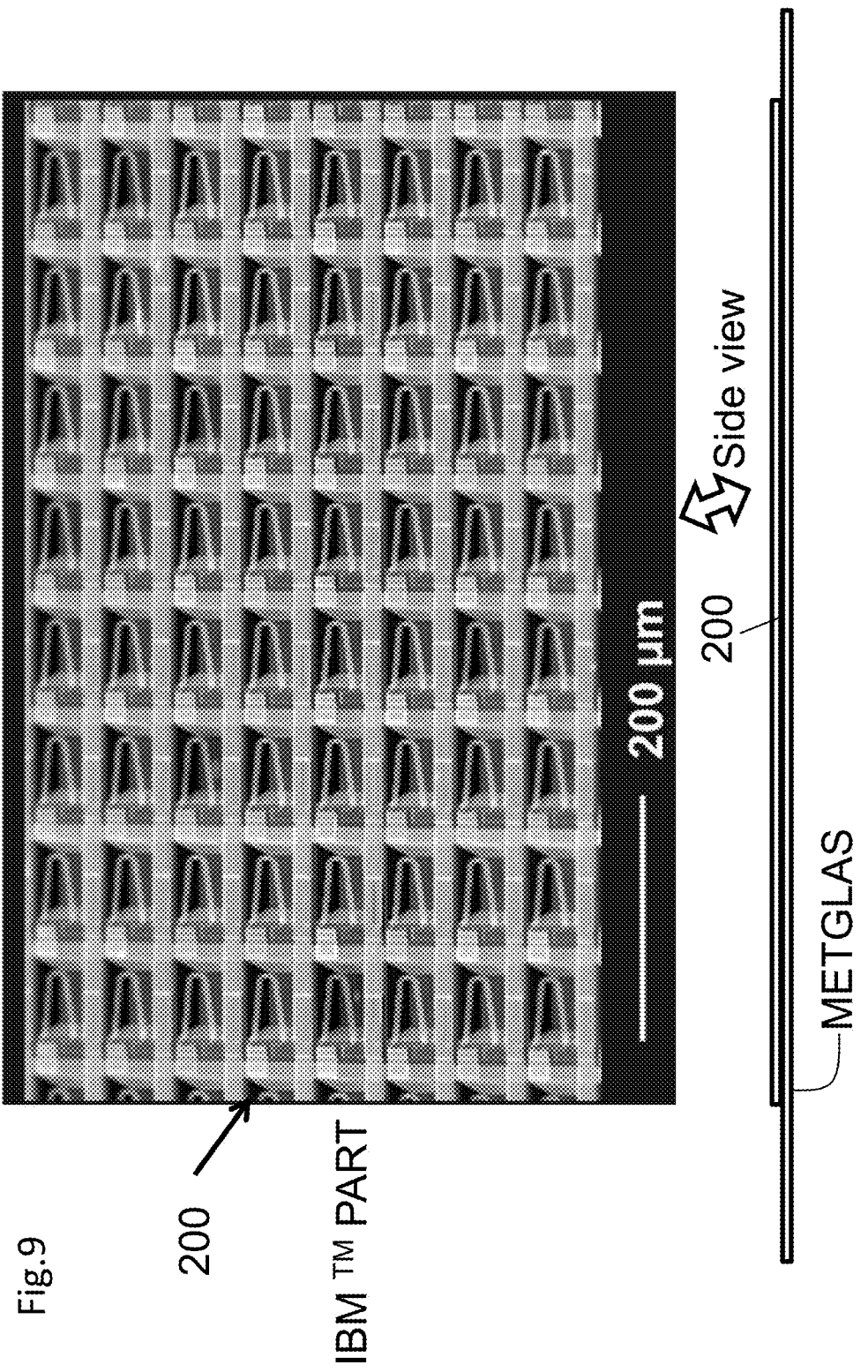
FIG. 9 is a picture of prior art of a Heated Cantilever Array

The STO 115 in FIG. 3 is positioned to hover proximate the magnetic media 120. The media 120 is comprised of first portions or bit regions 145 having a stable, nonvolatile state namely its magnetic permeability in a material such as Permalloy or Metglas. Metglas for example, may be written by laser heating such that cooling rates determine whether a bit region has a high (rapidly cooled, amorphous state) or low permeability (less rapidly cooled crystalline state). The laser produces two distinct permeability regions on the Metglas that represent 1's and 0's. The resultant bit data may be permanent provided the Metglas is not exposed to high heat (i.e. in excess of 500° C.). The bit regions 145 may be radially aligned or arranged as a grid for accurately locating and reading the individual regions 145 of the media 120. FIG. 9 is a schematic illustration of a grid or array of cantilever heating elements. When the tips of the cantilevers are hot they can be utilized to write bits into a medium such as Metglas. In FIG. 3, the STO 115 (also known as a spin transfer oscillator or spin transfer torque microwave oscillator) is comprised of a top electrode 155, a magnetic free layer 125, a non-magnetic layer 130, a magnetic pinned/fixed layer 135, and a lower electrode 160. Often an artificial antiferromagnet (not shown) is used to pin the magnetization of the fixed layer. A current is passed from the current source 105 through the STO 115 electrodes (155 and 160) such that spin polarized current passes through the insulator 130. The magnetic moment of the free layer 125 is in the plane parallel to the non-magnetic layer 130. Some embodiments may be comprised of an insulator material or non-magnetic material such as Magnesium Oxide (MgO) or Aluminum Oxide ($Al_2O_3$). In the combination of the fixed layer 135, insulator 130, and free layer 125 known as a magnetic tunnel junction, the non-magnetic layer or insulator layer 130 acts as a spacer to magnetically decouple the free layer 125 and the pinned layer 135. The structure of the STO 115 thus leaves the magnetic torque of the free layer 125 to rotate in response to external magnetic fields.

According to Wikipedia, the tunnel magnetoresistance (TMR) is a magnetoresistive effect that occurs in a magnetic tunnel junction (MTJ), which is a component consisting of two ferromagnets separated by a thin insulator. If the insulating layer is thin enough (typically a few nanometers), electrons can tunnel from one ferromagnet into the other. Generally, thin film technology or film deposition forms the magnetic tunnel junction which is accomplished by magnetron sputter deposition; molecular beam epitaxy, pulsed laser deposition or electron beam physical vapor deposition. The direction of the two magnetizations of the ferromagnetic films can be switched individually by an external magnetic field. If the magnetizations are in a parallel orientation it is more likely that electrons will tunnel through the insulating film than if they are in the oppositional (antiparallel) orientation. The magnetic field that determines the orientations of the two layers can be altered by the at least one second portions of high permeability. Consequently, such a junction can be switched between two states of electrical resistance, one with low and one with higher resistance which in effect measures whether the sensor is in close proximity to either a region of low permeability or high permeability.

In an STO, electrons driven from the pinned layer causes electrons to orient with the field of the pinned layer, then electrons interact with the free layer 125 to cause the magnetization of the free layer 125 to tend to align parallel with the magnetization of the pinned layer 135 (i.e. torque is transferred to the free layer). If the current direction is reversed the magnetization of the free layer 125 tends to align antiparallel with the magnetization of the fixed layer 135. This torque transfer can prevent the magnetization of the free layer from relaxing and aligning parallel with the magnetic field. This causes the magnetization of the free layer 125 to process around the direction of the magnetic field and radiate microwave energy at the Larmor frequency that is proportional to the vector cross product $\vec{M} \times \vec{H}$ where $\vec{M}$ is the magnetization of the free layer and $\vec{H}$ is the effective field acting on the magnetization of the free layer.

The current density driving the STO 115 must be very high (e.g. $10^7$ amps/cm²) and be spin polarized. The motion of the free layer 125 is governed by the Landau-Lifshitze-Gilbert (LLG) equation that includes the spin-transfer torque term:

$$\frac{\partial \vec{M}}{\partial t} = -\gamma \vec{M} \times \vec{H}_{eff} + \alpha \vec{M} \times \frac{\partial \vec{M}}{\partial t} - b_j \vec{M} \times \left( \vec{M} \times \frac{\partial \vec{M}}{\partial x} \right) \quad (1)$$

In equation (1), $\vec{M}$ is the magnetic moment. $\vec{H}_{eff}$ is the effective magnetic field (whether from the pinned layer or from an external source such as the magnetic media) and includes the anisotropy field, magnetostatic field, and exchange field. $\gamma$ is the gyromagnetic ratio, x is the direction of current flow and $\alpha$ is a constant which determines the relaxation rate. The quantity $b_j$ is given by $$b_j = P j_e \mu_B / e M_s \quad (2)$$

where P is the spin polarization of the current, $\mu_B$ is the Bohr magnetron, $j_e$ is the electric current density, and $M_s$ is the saturation magnetization value of M The first term on the right hand side of the equation (i.e. $-\gamma \vec{M} \times \vec{H}_{eff}$) gives rise to the precession and the second term $$\left(\text{i.e., } \alpha \vec{M} \times \frac{\partial \vec{M}}{\partial t}\right)$$

is responsible for the relaxation of the magnetization. The third term in Eq. 1 provides a torque that opposes the relaxation and keeps the magnetization of the free layer precessing at some angle relative to the effective field $\vec{H}_{eff}$. Note the dependence on the spin polarized current in this third term. The frequency of the microwave radiation is proportional to the magnitude of the effective magnetic field $\vec{H}_{eff}$. As will be discussed further below, if there is an external field, the effective magnetic field includes the fields from the other layers of the spin transfer oscillator and from the external field.

The high permeability regions change the effective magnetic field $\vec{H}_{eff}$. This in turn changes the frequency of the STO 115 microwaves such that there is a measurable change in the frequency detected by the spectrum analyzer 110. The change is due to the amount of permeability for a specific bit area/region on the media 120. The permeability of the media modifies the magnetic field $\vec{H}$ from equation (1) in that magnetic field lines are attracted into the regions of the media with high permeability. Depending of the geometry, i.e., the position of the high permeability regions in the media relative the STO 115 this can either increase or decrease the first term in Eq. 1. This will change the precession frequency. Since the STO 115 has a high quality factor (Q), small changes in the microwave radiation are easily detectable as shifts in this microwave precession frequency. The voltage across the STO may be directly measured with the spectrum analyzer 110 such that the change in the precession frequency is detected, or indirectly, the amplitude and the width of the resonance frequency change may be measured. Other embodiments may include an antenna to indirectly capture and couple the signal to the spectrum analyzer 110.

The magnetically permeable media 120 will modify the RF signal from the STO 115 in two ways. Firstly, the permeability will modify the magnetic field at the position of the STO 115 by modifying magnetic flux. Modifying the field will shift the precession frequency and hence also shift the frequency of the RF signal. Secondly, the media 120 will absorb microwave energy because of resistive losses. Since energy is absorbed into the media, this will affect the spin oscillation in the STO free layer and lower the Q.

As the reader 100 operates based on the magnetic permeability of the media 120, the memory is non-volatile as permeability is an intrinsic property. Lifetime integrity is also extended almost indefinitely as the media 120 no longer needs to have a minimum energy for maintaining the magnetization direction that determines the bit value of the individual bit regions. Furthermore, since the reader 100 is not reliant on the magnetization direction of the regions, the media 120 is not limited by the superparamagnetic limit and may have greater bit density. Thus, in some exemplary embodiments, the reader 100 may read bits that are 20×20 nm or 400 nm with a bit density of $2.5 \times 10^{11}/cm^2$. The bit values detected by the spectrum analyzer may then be output to a computer for additional processing of the information.

FIG. 4 is a schematic, diagrammatic illustration of an exemplary embodiment of the present invention utilizing an STO with a spectrum analyzer to read magnetic media while applying a magnetic field. The reader 200 comprises a constant current source 205, spectrum analyzer 210, STO 215, media 220, and permanent magnets (shown as 225 and 230). The spectrum analyzer 210 and STO 215 are electrically connected in parallel and the STO is positioned to hover above the media 220. The reader 200 uses permanent magnets (225 and 230) to supply the external magnetic field that will result in a desired microwave precession frequency. Further embodiments may replace the permanent magnet(s) (225 and 230) with electromagnet(s).

The addition of the permanent magnets (225 and 230) allows for improved freedom to tailor the STO 215 for particular media 220 by modifying the frequency of the microwave radiation from the STO 215. The frequency modification may also allow using the maximum sensitivity of instruments such as the spectrum analyzer 210. FIG. 4 depicts the exemplary embodiment, including placing permanent magnets (225 and 230) of opposite polarity on either side of the STO 215 and allowing the magnetic field 235 to change the microwave frequency emitted by the STO 215 and measured by the spectrum analyzer 210. Further embodiments may use one permanent magnet or multiple magnets or electromagnets to create an external magnetic field 235 and may be proximately located to the STO 215 as necessary to alter the microwave radiation from the STO 215.

Figure 5:
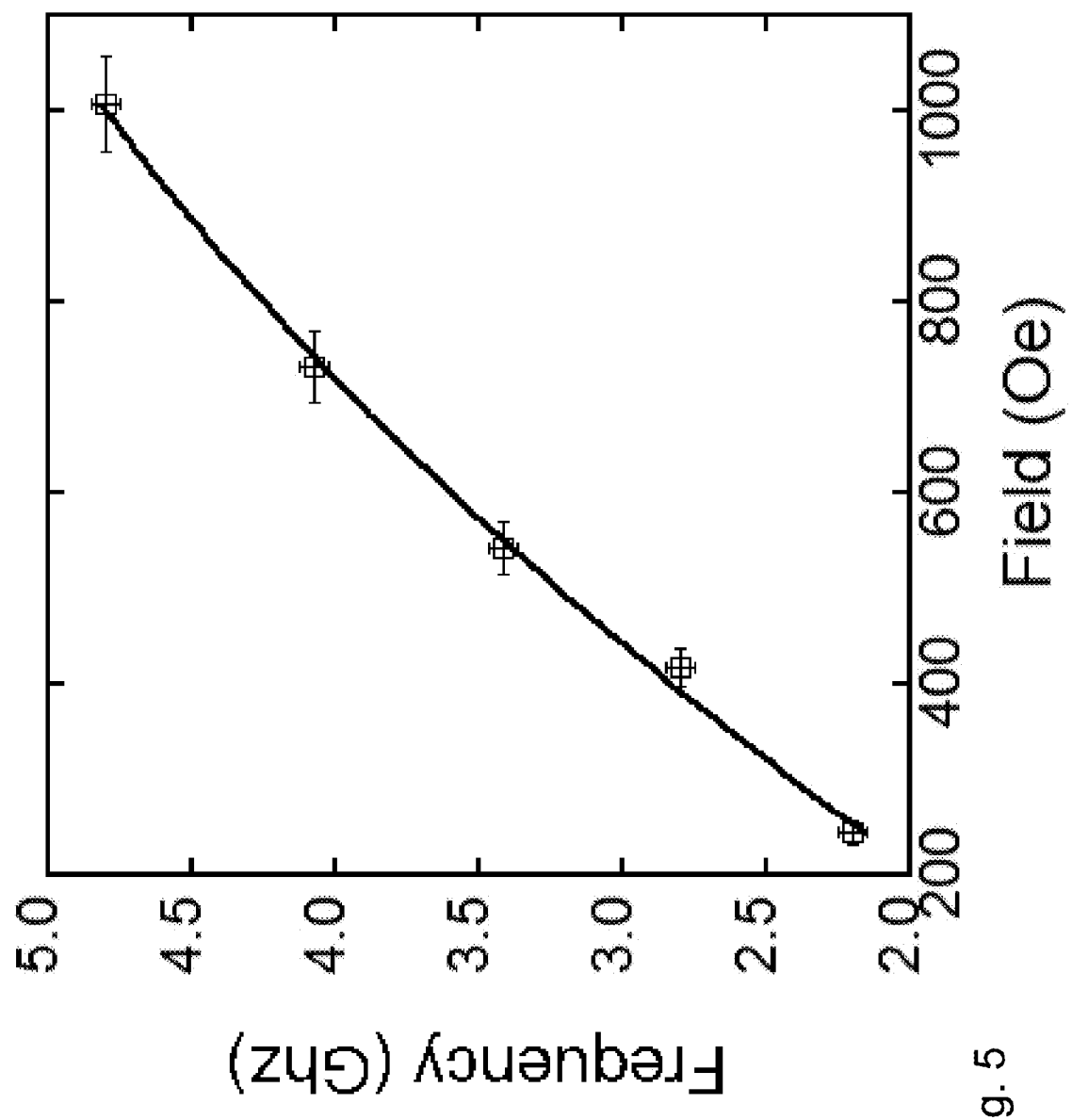
FIG. 5 shows how the frequency of an STO varies as a function of an applied external field.

FIG. 5 is an graph of an exemplary emitted microwave precession frequency shift of an STO 215 at different external magnetic field strengths. The field is varied by changing the separation distance between the permanent magnets (225 and 320). The large shift in the frequency due to the permanent magnets allows the STO 215 to operate at varying frequencies without having to include additional electronics for controlling the STO 215.

Figure 6:
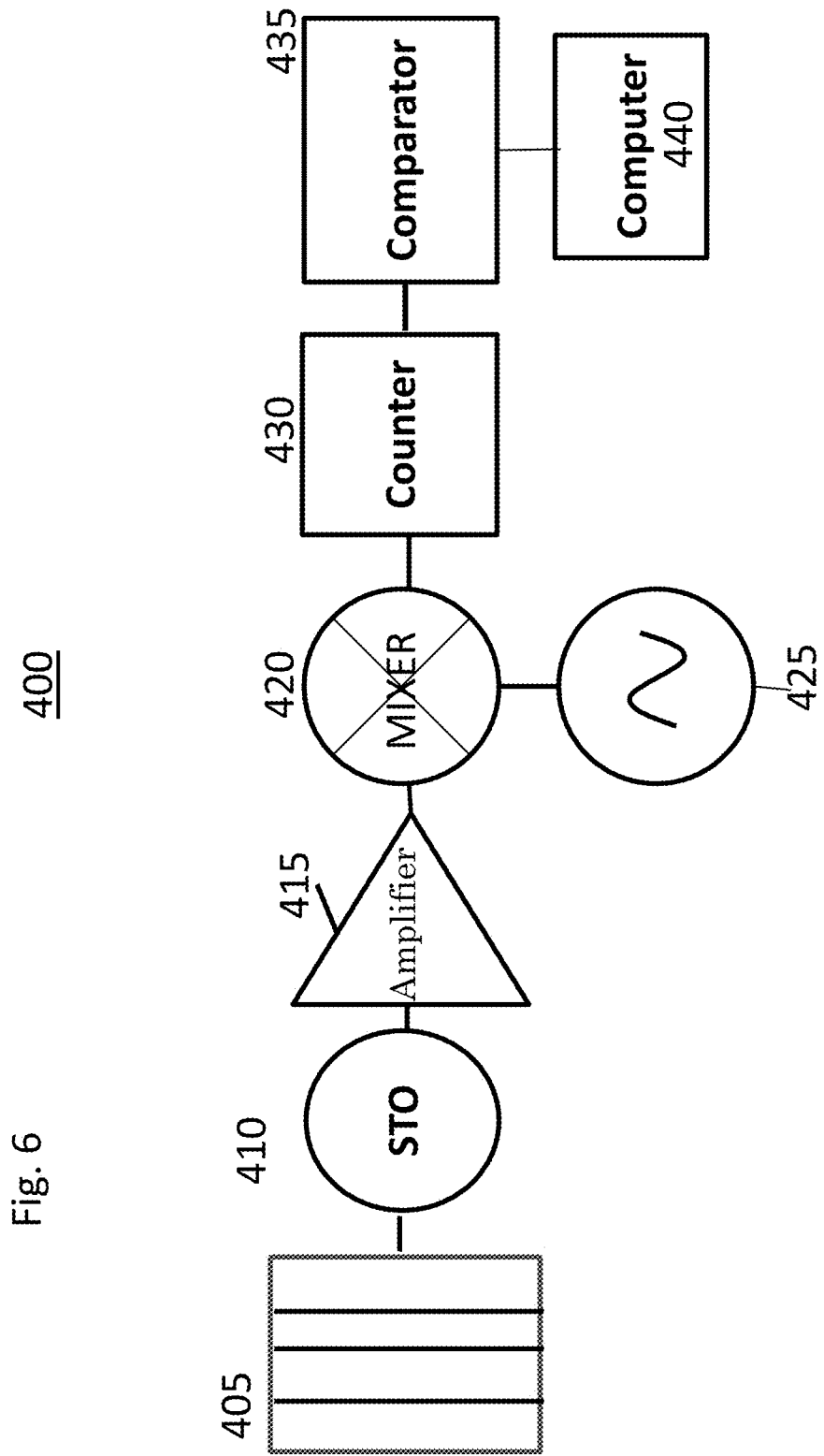
FIG. 6 is a schematic of an exemplary embodiment of the present invention utilizing a superheterodyne receiver and an STO to read magnetic media.

FIG. 6 is a schematic of an exemplary embodiment of the present invention utilizing a superheterodyne receiver and an STO to read magnetic media. The reader system 400 comprises bit memory regions of magnetic media 405, a STO 410, an external magnetic field of 300-900 Oe, an amplifier 415, a mixer 420, a filter (not shown), a local oscillator 425, a counter 430, a comparator 435, and a computer 440. A superheterodyne receiver comprises amplifier 415, mixer 420, filter, and oscillator 425. Bit regions 405 are positioned in close proximity to the STO 410. A microwave signal is emitted from the STO 410. The resulting signal from the STO is coupled to an amplifier 415 such as a low noise amplifier (LNA). The amplifier sends the signal to a mixer 420 that is down-converted with a local oscillator 425, which may used as a reference oscillator and set to a frequency within megahertz of the STO with no media present. The difference frequency ($\Delta f$) is outputted from the mixer 420. The mixing is necessary as the STO 410 resonates at such a high frequency, that sampling it directly with a spectrum analyzer would be difficult. The local oscillator 425 provides an RF signal near the unshifted frequency of the STO such that output frequency of the mixer is in the MHz range. The mixer output is filtered by the filter (not shown) to remove side bands. The resultant signal from the filter is then able to be directly measured by the frequency counter 430 (which determines the RF frequency).

The frequency counter digitizes the resulting IF signal for the threshold comparator 435. The comparator 435 compares the outputted $\Delta f$ output with some accepted value; for example, the predefined accept value may be determined based upon whether the shift frequency is greater than one half the expected $\Delta f$. The comparator 435 applies predetermined known criteria for anticipated frequency shift values for a high or low permeability bit. The results of the high or low bits (i.e. "1" or "0") are then output for processing by a computer 440 comprising a CPU, memory, A/D converters, D/A converters, and digital signal processing ultimately leading to a user interface. Further embodiments may include the measured change in the frequency response as a change in quality factor, gain, or impedance matching.

FIG. 7A depicts an exemplary flow diagram to determine bit values of the read media. The method 500 begins at step 505 and aligns a STO above magnetic media at step 510. For example, the STO may be aligned above media at first location to determine whether or not bit is present and if so, the value. In some embodiments, the alignment may be achieved through the STO mounted on a mechanical arm suspended over a rotating media disk. A current is then passed through the STO at step 515 such that the STO radiates an RF signal. The frequency of radiation will change if the effective magnetic field acting on the free layer is changed by high magnetic permeability bits to be measured at step 520. The measurement from step 520 is then compared according to predetermined criterion to determine the bit value at step 525.

The criterion includes a threshold for a "1" bit value at step 530, which if returned true, flags the bit location as a "1". The method then determines if there are more bits to be read at step 555, which if true proceeds 565 back to align the STO with the next bit in the media or else the method ends 560. However, if at step 530 it is determined the "1" bit value threshold is not met, the method determines whether the threshold for the bit value is a "0" at step 535. Should the threshold for bit "0" be met, the bit location is accordingly flagged 545 as a "0" and the method continues to determine if more bits are to be read at step 555. However, if step 535 determines the threshold for the "0" bit value is not met the method ends 540 as an error or inconclusive reading. One of ordinary skill in the art would know of a variety of methods for dealing with this situation. For example, the cycle could be repeated and if the threshold still is not met, a determination of the value of the bit might be deduced from the context of information about neighboring bits. An alternative would be planned redundancy, in crucial places, where bits are essentially duplicated. Error correcting methods could also be used. In an exemplary embodiment, wherein the frequency response is measured, the measured frequency shift is compared 525 with predetermined frequency criterion for bit values. As an example, a "1" is where $|\Delta f| > |\Delta f_1/2|$ and "0" is $|\Delta f| \approx 0$, where $\Delta f_1$ is the preset expected value for the high permeability bit.

FIG. 7B is a flow chart similar in nature to FIG. 7A except that in FIG. 7B, the change in voltage across an MTJ in series with a constant current source is being measured in box 520A and the comparison is made with respect to a reference voltage in box 525A.

Figure 8:
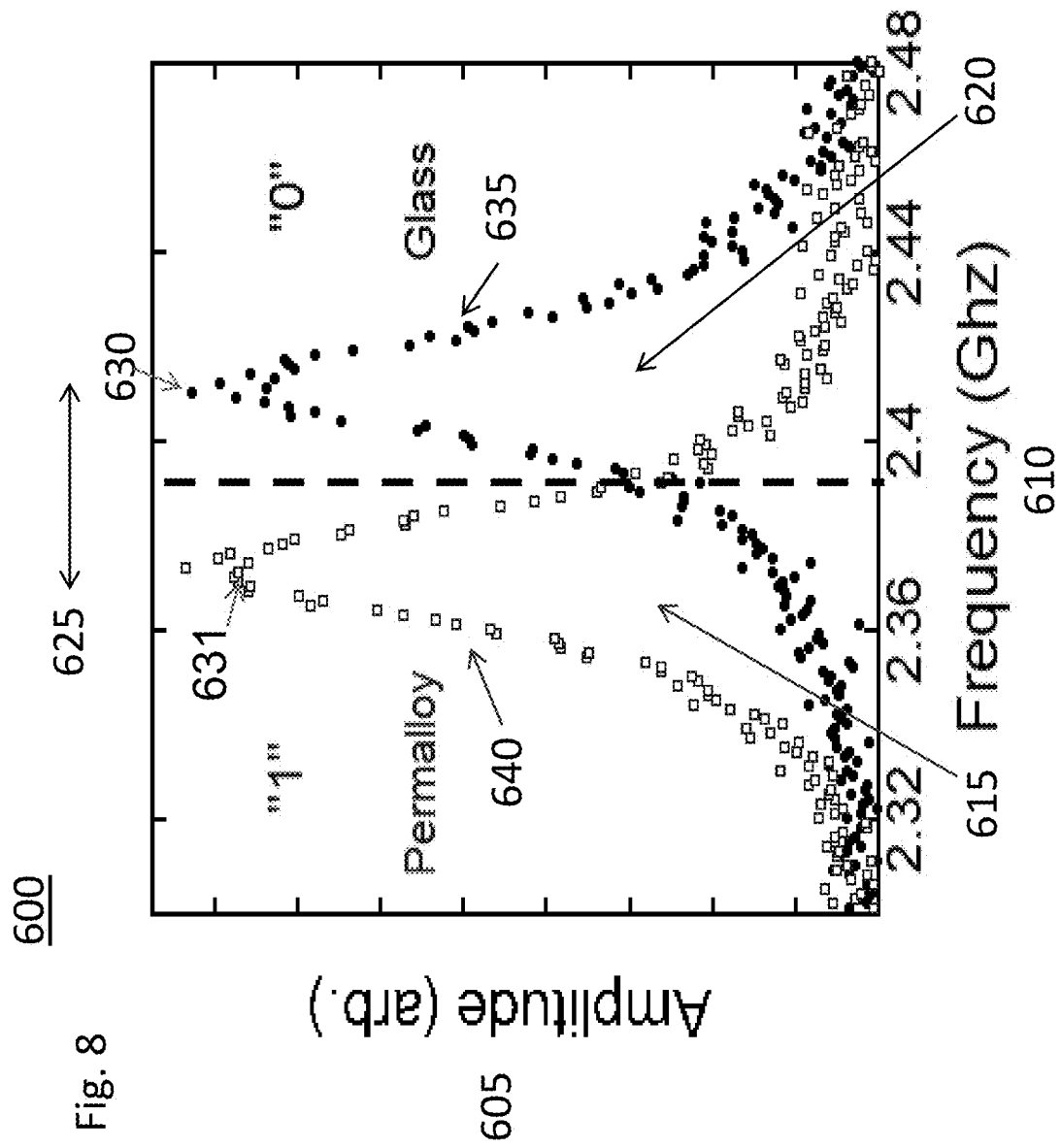
FIG. 8 is a graph of an exemplary comparison threshold applied in FIGS. 6 and 7A.

FIG. 8 is a graph 600 of an exemplary comparison threshold applied in FIGS. 6 and 7A. The graph 600 plots the amplitude 605 of the resultant signal from the STO versus frequency 610. The curve to the right depicts the output signal from the STO criterion for "0". Note that the center frequency is held at approximately 2.42 GHz for a known low permeability bit. The curve to the left depicts the criterion for the "1" bit value such that the center frequency 631 is held approximately at 2.37 GHz. Following the criteria above, if it is determined that a frequency change 625 that is more than half the difference of preset expected value 630 minus the present value 631 of the high permeability bit, the bit is a "1". Also following the criteria above, if the frequency change 625 is near zero, the bit value remains "0". In this embodiment, the high permeability bit state 640 is held to be a "1" and the low permeability bit state 640 is held to be a "0". However, further embodiments may reverse this bit classification such that the low permeability is held as a "1".

Other, further embodiments may include rewritable media such as the ferromagnetic class of alloys known as Metglas. Metglas is a material that has a high magnetic permeability of approximately 10,000 N·A$^{-2}$ in the amorphous state and a low permeability of approximately 5-10 N·A$^{-2}$ when it is crystalline. By controlling the cooling rate from above 800° C., that results from heating by, for example, using an e-beam or evanescent wave, it is possible to rewrite the media by making the material either crystalline or amorphous. Other embodiments may include multiple levels that are based on corresponding levels of permeability and saturation. The multiple levels of permeability may thus also allow for more information to be stored per bit area and/or greater bit density. Nevertheless, the reader disclosed above utilizes intrinsic magnetic permeability and thus provides the ability to read magnetic media that is effectively immune from corruption by magnetic fields.

FIG. 9 is a schematic illustration of a prior art cantilever array used for heating made by International Business Machines, Inc. that can be positioned over a section of Metglas and used for controlling the crystalline phase of the Metglas.

Figure 10:
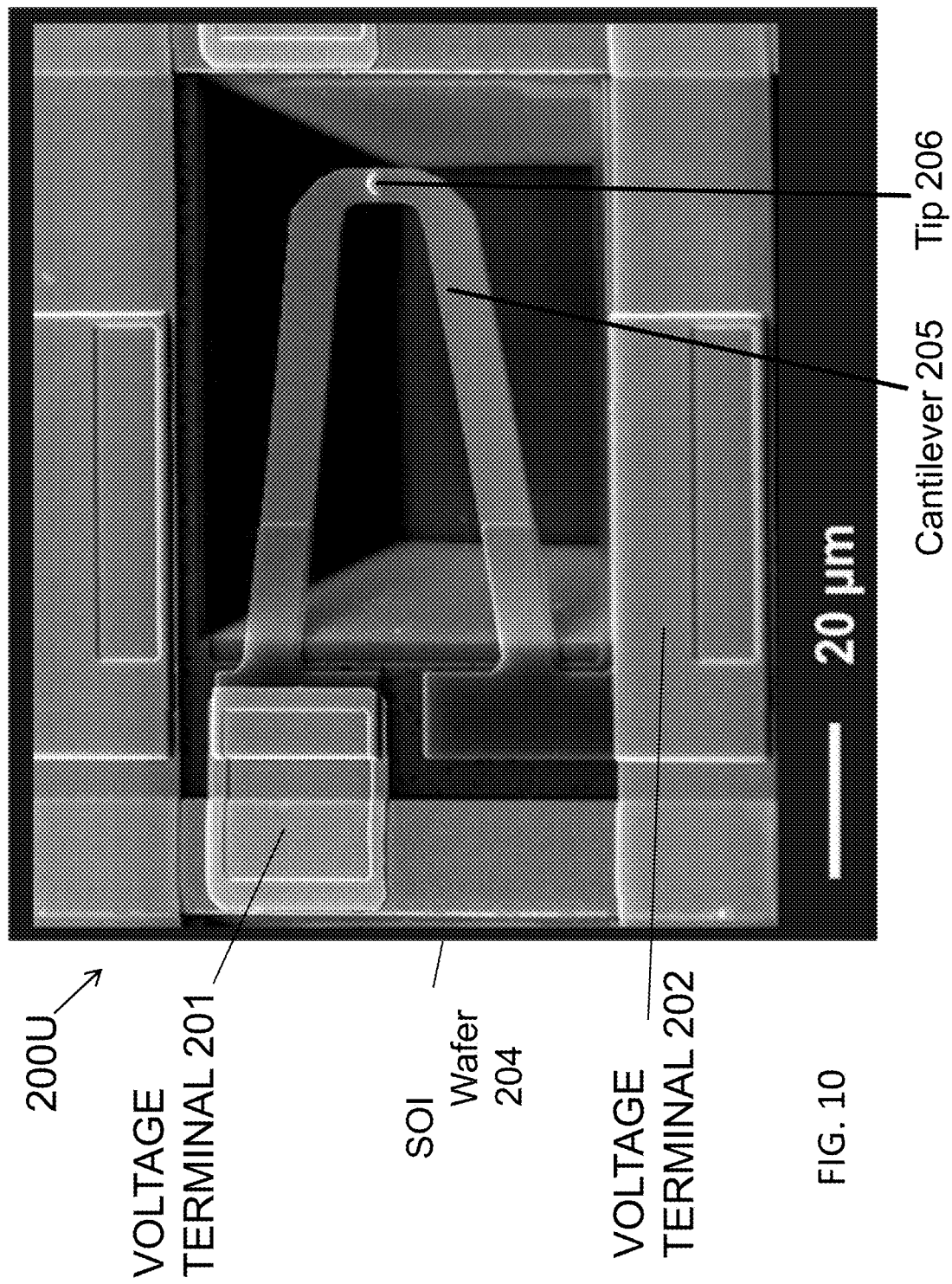
FIG. 10 is a picture of a prior art of one unit or section of the Heated Cantilever array used for writing.

FIG. 10 is a schematic illustration of one section or unit of a heated cantilever array made by International Business Machines, Inc. positioned over a section of Metglas (not shown). The unit 200U comprises a first and second voltage terminals 201 and 202 and a cantilever 205. The tip 206 of the cantilever may be doped differently than the rest of the cantilever so that the tip becomes hot and either touches or comes into close proximity with the media (Metglas). The Metglas is an amorphous material, and, when heated, crystallizes and forms regions of lower permeability. Thus, regions of lower permeability (bit regions) may be formed when the tip 206 engages or nears the Metglas. The use of the array illustrated in FIG. 9 recognizes the need to write bits on 100 nm or smaller scale. The heating with cantilever may be utilized on SOI wafers with the tip being doped differently than the rest of the cantilever. The FIG. 9 array may be used to form nano-scale data. The bit indents in polymer media (IBM) utilize millipede technology. This has been done by putting in the heated tips in contact with media. One may attempt to avoid contact and use preset temperature of heating the entire media of only 350° C. to minimize the amount of local temperature rise provided by the hot tip. Using similar mechanisms, to date, have made use of 0.2 μm×0.3 μm heaters. With other heaters, it has been possible to write on at a 10 nm scale. It is also possible to use lasers and joule heating to heat Metglas and write the bits.

Returning now to the preferred embodiment shown in FIGS. 2A and 2B, FIG. 11 is an illustration showing the percentage tunneling magnetoresistance (TMR) of an MTJ reader chain in different magnetic field strengths. TMR and sensitivity for the MTJ reader chain is depicted. The black boxes show percentage changes in the tunneling magnetoresistance (TMR), while the hollow boxes show show the sensitivity as a function of the field acting on the MTJ. Field shunting or enhancement at the reader is determined by respective negative or positive changes in the TMR.

Figure 12:
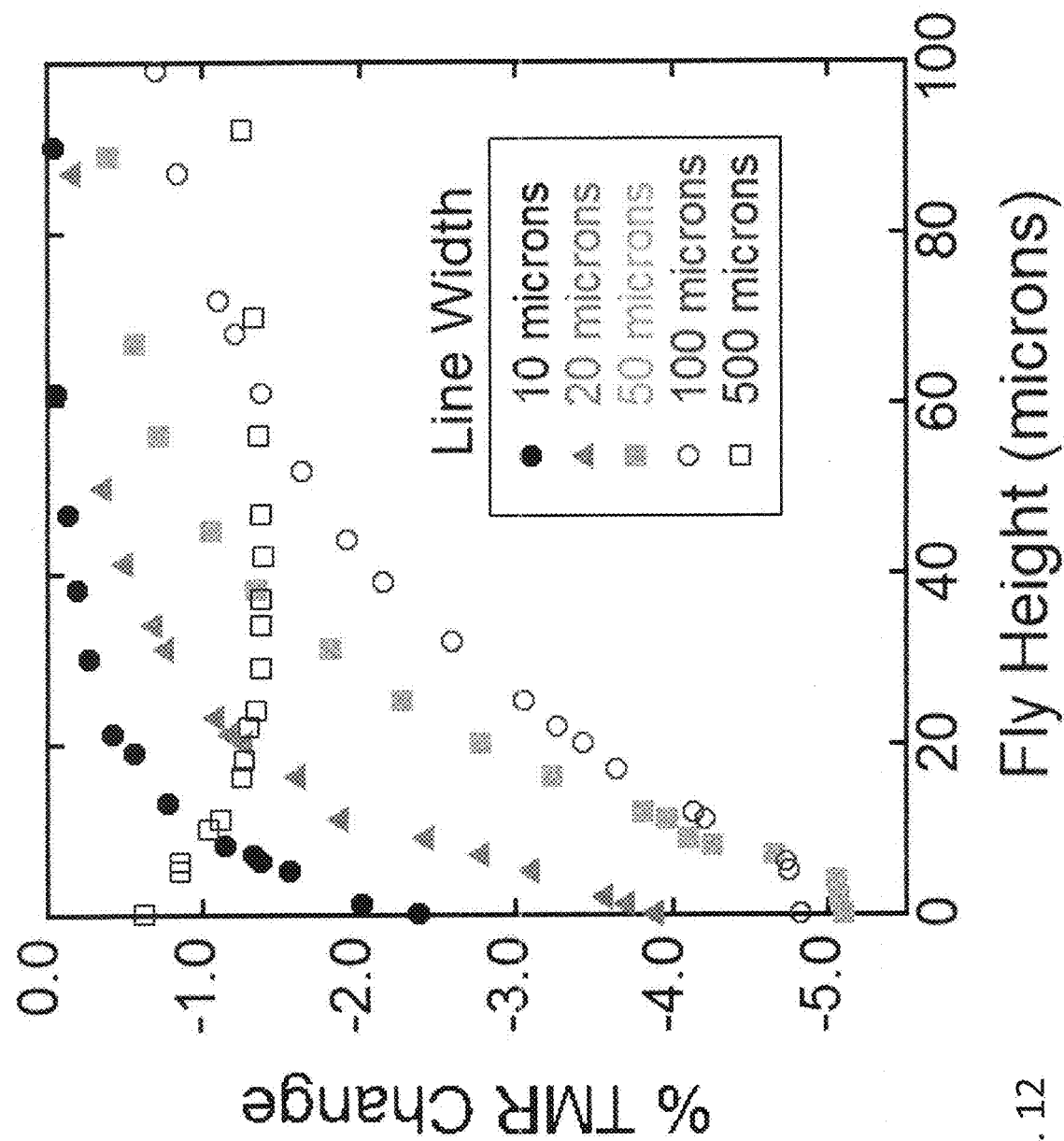
FIG. 12 is an illustration showing percentage change in TMR versus fly height d for different widths w of a single permalloy line centered over the reader in a 32 Oe probe field.

FIG. 12 graphically shows the percentage TMR change (ΔTMR) resulting from placing the reader directly under the center of a single permalloy line of varying width w at a fly height d in a 32 Oe external probe field. Since the permalloy attracts magnetic flux, placing it in close proximity to the MTJs changes the external probe field at the position of the reader. For a 10 micron wide line, where the width of the line is comparable to the width of the reader, the (ΔTMR) has a maximum value of −2.5% at the minimum fly height separation. This result implies that 8 Oe is diverted away from the reader by the presence of the permalloy. Generally, at progressively larger widths, the shunting effect increases as more flux is diverted into the permalloy and away from the reader. The shunting effect reaches a maximum ΔTMR of −5% near a width of 100 microns, revealing that ~13.5 Oe, or over 40% of the probe field, is shunted. The shunting effect diminishes for widths much larger than 100 microns, as it becomes increasingly difficult to affect the magnetic flux near the center of the permalloy line where the reader is located. The minimum bit size is limited by the size of the reader, the fly height distance, the permeability of the soft magnet, and the sensitivity of the sensors. Modeling results using the finite element code MAXWELL 3D support this conclusion.

FIG. 13 shows the ΔTMR that results from sweeping the reader in a 32 Oe external field under the group of three lines (i.e. high permeability bits) shown in FIG. 2B with width w=10 microns, a lateral separation of 50 microns, and a fly height d=5 microns. The signal-to-noise ratio (SNR) for the ΔTMR valleys attributable to field shunting is ~45 dB. The small TMR increase associated with a field enhancement around each valley occurs as the reader passes under the edge of each line and into the path of flux attracted by the permalloy. In another embodiment, the small peaks associated with these TMR increases could also serve in bit detection.

In FIG. 14A, the reader is swept at approximately 3 Hz and 30 Hz under a group of three lines with w=50 microns, a lateral separation of 50 microns, and d=10 microns. The amplitude and SNR in both cases are comparable to situation depicted in FIG. 13 where the sweep rate was slower. The insensitivity to sweep rate indicates our approach has a scalability towards higher reading rates. FIG. 14B shows data taken using a similar ~3 Hz sweep both before and after the media was exposed to a large 6400 Oe field for 60 seconds. Such sweeps, of which the post-field scan is representative, were repeated multiple times with the 6400 Oe field at different orientations to the reader. Within experimental error, the amplitude and SNR is unchanged, indicating the non-erasability of the information in large magnetic fields.

In accordance with the above, one can read 10 micron wide non-erasable (or nonvolatile) magnetic lines and distinguish regions of high and low permeability with a SNR of 45 dB. In addition to showing that the read rate is capable of improvement, an increase in the SNR is expected to be obtainable by optimizing the performance of our MTJ readers. Since the lower limit on media size is determined by the reader dimensions and fly height, and not the thermal stability of the media, higher density media are not constrained by the superparamagnetic limit. Through the effect of shunting of flux across a gap in a magnetic circuit by a soft magnetic material, a reader can detect an enhancement of the probe field and thus sense the presence of soft ferromagnetic media, field in other configurations as reported in U.S. Pat. No. 7,233,142 to Edelstein, hereby incorporated by reference as though fully rewritten herein. In fact, any detectable change in the probe field magnitude and/or direction due to differences in media permeability should suffice for the reading process Finally, because e-beam writing is expensive, alternative methods for low cost recording/re-writing of media consisting of regions of high and low magnetic permeability may be utilized without departing from the scope of the invention. The ability to write as well as read such non-erasable (or nonvolatile) media can potentially fulfill the growing need to store both large and small amounts of data indefinitely.

Turning now to FIG. 15, a comparison of read heads is illustrated. In the left portion, the bit is determined by the direction of the magnetic field generated by the remanent magnetization in the bits of the media. This illustrates current magnetic memory technology that senses the direction of magnetic domain fields; an extrinsic property. The disadvantages include information can be erased by exposure to magnetic fields or radiation and thermal instability leading to superparamagnetism constraints on the density of information and storage lifetime (usually <7 years).

Shown to the right in FIG. 15 the non-erasable (or nonvolatile) magnetic memory of the preferred embodiment senses the modification of a probe field ($H_{probe}$) by the magnetic permeability ($\mu$) of a soft ferromagnet; an intrinsic property. The advantages are that the storage is unaffected by magnetic fields or radiation, thermal instability does not lead to superparamagnetism constraints limiting information density & storage lifetime, and the probe field may be tailored to the read head/media.

Types of writing using preferred embodiments of the present invention include: (A) e-beam writing (optical lithography), which may be utilized in conjunction with a non-erasable (or nonvolatile) card system (10 μm capability) and has the potential for permanent archiving at 50 nm. (B) Thermal laser writing, which may be utilized in conjunction with a non-erasable card system (10 μm capability) and has the potential for permanent archiving at 50 nm with 20 msec. writing time. (C) Thermal hot tip or ohmic heating writing, which has capability of writing on a 10 nm scale. (D) Thermal joule writing with an scanning tunneling microscope, which has the capability of writing at the 10 nm scale. The thermal writing can be aided by heating the all of the media so that the energy needed for writing individual bits is smaller. (E) Dip pen writing or magnetic ink jet writing, which has a potential for writing on a submicron scale. One can use an MTJ reader (20 nm) and STO reader with a read time of 20 μsec.

Thermal writing and reading with MTJ/STOs is applicable towards radiation hard DOD, space applications, magnetic swipe cards, and ID tagging. Archiving at current information density is expected for thermal writing with cantilevers (shown in FIG. 9) and MTJ/STO reading is very likely. Information written in this manner is intrinsically robust and difficult to tamper with or change.

FIG. 16 is a schematic illustration depicting an optical microscope 13 having a media 14 consisting of glass upon which a highly permeable media such as permalloy is deposited and read by reader 17 as described above.

FIG. 17 is a schematic illustration depicting a die with a set of 4 MTJ readers 17 thereon. Electrode leads run to one side of die (bottom in picture) so wire bonding does not limit fly height separation between readers and media.

FIG. 18 is a schematic illustration of an STO, microwave probes 701 and permalloy lines 702 on glass slide.

FIG. 19 is a graphical illustration showing the data from the spectrum analyzer 110 displaying a shift in microwave precession frequency as a 50 μm permalloy line centered above the STO is separated at various fly heights above the STO in a 540 Oe external probe field. The greatest shift in precession frequency occurs at the closest fly height separation between the permalloy and STO.

Alternatives to highly permeable permalloys and low permeability air for use in conjunction with the present invention include soft amorphous ferromagnetic material with magnetic species (e.g. Fe) and network glass formers (e.g. Si, B) that hinder nucleation (e.g. Metglas 2605-SA2, with composition $Fe_{0.78}Si_{0.13}B_{0.09}$). Optical or electron beam lithography may be utilized as well as, potentially, dip pen deposition. For thermal writing on Metglas, one could sputter amorphous phase which is magnetically soft and has high permeability greater than 10,000. The crystalline phase has low magnetic permeability ~10. An alternative is to go from amorphous to crystalline phase in Metglas by heating above the glass temperature, 400-500° C. Another alternative is to go from crystalline to amorphous phase by first melting (1100° C.) followed by rapid quenching, $10^{6°}$ C./sec. In another alternative for non-rewritable storage, thin superparamagnetic layers of a magnetic species (e.g. Fe) could be interspersed with non-magnetic layers (e.g. Cu). Before heating, the layers would have high permeability. Selective heating of regions (i.e., bits) would induce interdiffusion between the layers, resulting in low permeability regions. Presently thermally writing is being done with a laser.

FIG. 20 illustrates writing on Metglas 2605-SA2 with a 1.966 μm laser at 4.3 W for 3 sec exposure (roughly). The regions outside of the laser writing have high magnetic permeability. The lines of crystalline material resulting from the laser heating have low permability.

FIG. 21 illustrates a further example of writing on Metglas 2605-SA2 with a 1.966 μm laser at 2.9 W for 3 sec exposure (roughly). Surface facing sensor (exposed to environment) is oxidized. No 'burn' marks evident from laser.

FIG. 22 diagrammatically illustrates precessing of the magnetization $\vec{M}$ in an effective magnetic field at the Larmor frequency. The Larmor frequency is altered by changing the effective field using soft magnetic material near the STO; and the effective field can be large, e.g., greater than 100 Oe. Thus, one can read high permeability bits using spin torque oscillators (STO). Having a reader that operates in large fields may be an advantage since one may have to use large fields for small bits with reduced permeability per unit volume.

FIG. 23 diagrammatically illustrates the reading of bits using spin torque oscillators (ST0) based on using the spin polarized currents as postulated by Slonczewski in 1996.

It is noted that magnetization M tends to precess around magnetic field H and to relax into the direction of the field. The spin polarized current can maintain the angle between M & H and the system radiates at a microwave frequencies dependent on H; and the changing H via soft magnetic material changes the frequency of the STO. The sense element size is 100 nm. Thus, one can probably read 100 nm bits if the fly height is of order 100 mm or still smaller.

Using the preferred embodiments, reading 10 micron wide permalloy lines with a 45 dB signal to noise ratio have been attained using magnetic tunnel junctions. Spin transfer oscillators can also be used for reading. Potential applications include tagging, a magnetic card reader, magnetic tunnel junctions used for reading, laser thermal writing of magnetic material, securely storing large amount of data indefinitely, ability to go to sub microns features, 100 nm spin transfer oscillators (STO), and high density magnetic recording.

Alternate approaches within the scope of the present invention include initially using a hot plate to heat Metglas above glass temperature 400 degrees° C. so that it will crystallize and enable operator to "write" a line at a lower localized thermal energy than otherwise. FIG. 24 illustrates alternative writing approaches utilizing the principles of the present invention. The present invention contemplates dip pen writing, which is at present limited to micron size features. One can use parallel tips 500. Issues remain with wetting. Another form of thermal writing would involve a hot 'filament' (e.g. Tantalum wire) 510 that can transfer energy to the magnetic media (e.g. magnetic swipe card) to form lines of high and low permeability.

Alternate approaches towards writing include e-beam writing, sputtering soft magnetic film, laser control of amorphous and crystalline phases, ink jet-like printing of the high magnetic permeability bits, creating nanoparticle slurry, dip pen writing, and thermal writing with sub-micron pens.

Advantages of the preferred embodiment systems include the features that the information is not erased by magnetic fields or radiation; not affected by superparamagnetic limit; a card write and read systems with these advantages: very large commercial potential for a system that can securely store large amounts of data for decades, low cost writing of bits, low density applications, difficult to tamper with or modify the data, e.g., ID cards, using laser thermal writing of Metglas, high density applications using dip pen or thermal writing of Metglas with heated element.

As used herein, the terminology "mixer" or "frequency mixer" refers to a circuit that creates new frequencies from two frequencies f1 and f2 that are inputted so as to produce the sum f1+f2 and/or difference f1−f2 of the original frequencies.

As used herein the terminology "processor" includes computer, controller, CPU, microprocessor; multiprocessor, minicomputer, main frame, personal computer, PC, coprocessor, and combinations thereof or any machine similar to a computer or processor which is capable of processing algorithms.

As used herein, the terminology "substrate: means a substance or layer that underlies something, or on which some process occurs.

As used herein the terminology the terminology "process" means: an algorithm, software, subroutine, computer program, or methodology.

As used herein, the terminology "algorithm" means: sequence of steps using computer software, process, software, subroutine, computer program, or methodology.

As used herein, the term "medium" or "media" (plural) means a material or substance regarded as the means of transmission of a force or effect; or a channel or system of communication, information, or entertainment; or a mode of expression or communication or something (as a magnetic disk) on which information may be stored.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A system for storing information in a nonvolatile memory comprising:
   a substrate;
   magnetic material operatively associated with the substrate, the magnetic material having first portions of low permeability configured to store bits of data and second portions of high permeability configured to store bits of data; the second portions configured to be modifiable to become portions of low permeability upon heating to permit modification of the bits of data;
   at least one magnet configured to provide at least one magnetic probe field; the first and second portions being subjected to the at least one magnetic probe field;

a reader comprising a sensor in close proximity to the first and second portions that reads information by detecting changes in the at least one magnetic probe field dependent on the magnetic permeability of the first and second portions.

2. The system of claim 1 wherein the strength and direction of the at least one magnetic probe field can be varied independently of the reader and can be adjusted to enhance the reading of the first and second portions of magnetic material, and wherein the at least one magnet comprises one of a permanent magnet or electromagnet.

3. The system of claim 1 wherein the reader comprises a magnetoresistive sensor configured to measure the magnetic permeability of the first and second portions by subjecting them to the at least one magnetic probe field of approximately 1-100 Oe and measuring the change in the magnetoresistance.

4. The system of claim 1 wherein the second portions having high permeability are configured to be modifiable to create portions of low permeability by heating the magnetic material to 400 to 500° C. to change the atomic structure, and wherein the area not heated maintains high magnetic permeability.

5. The system of claim 1 wherein a first portion having low permeability is configured to be modifiable to create a portion of high permeability by heating the magnetic material and controlling the cooling rate by quenching the first portion.

6. The system of claim 1, wherein the first and second portions have a density of at least approximately $2.5 \times 10^{11}/\text{cm}^2$.

7. A system for storing information in a nonvolatile memory comprising:
a substrate;
magnetic material operatively associated with the substrate, the magnetic material having at least one first portion of low permeability and at least one second portion of high permeability;
at least one magnet configured to provide at least one magnetic probe field; the at least one first and second portions being subjected to the at least one magnetic probe field;
a reader comprising a spin torque oscillator (STO) sensor in close proximity to the at least one first and second portions which measures the magnetic permeability of the at least one first and second portions; and wherein the magnetic probe field is approximately 100-3000 Oe and originates from either an external source, the reader, or a combination thereof, and wherein the reader detects changes in the at least one magnetic probe field by measuring the changes in the microwave radiation emitted by the STO dependent on the magnetic permeability of the at least first and second portions.

8. A method of reading information from a magnetic medium based upon the magnetic permeability comprising:
providing first and second portions of varying magnetic permeability on a medium;
subjecting the first and second portions to at least one magnetic field probe field from at least one magnet;
aligning a reader in close proximity to the medium;
measuring a response of the reader;
reading information by detecting changes in the magnetic probe field dependent on the magnetic permeability of the first and second portions.

9. The method of claim 8 wherein the strength and direction of the at least one magnetic probe field can be varied independently of the reader and can be adjusted to enhance the reading of the first and second portions of magnetic material, and wherein the at least one magnet comprises one of a permanent magnet or electromagnet.

10. The method of claim 8 wherein the reader comprises a magnetoresistive sensor which measures the magnetic permeability of the first and second portions by subjecting them to the at least one magnetic probe field of approximately 1-100 Oe and measuring the change in the magnetoresistance.

11. The method of claim 8 wherein the reader comprises a spin torque oscillator (STO) sensor which measures the magnetic permeability of the first and second portions; and wherein the magnetic probe field is approximately 100-3000 Oe and orginates from; from either an external source, the reader, or a combination thereof, and wherein the reader detects changes in the magnetic field by measuring the changes in the microwave radiation of the STO.

12. The method of claim 8 wherein the reader comprises a spin torque oscillator that radiates an electromagnetic signal which is effected by the first portion or second portion to be measured and wherein changes in the magnetic probe field modify the frequency of the spin torque oscillator such that a frequency shift is observed, and wherein the effected electromagnetic signal from the spin torque oscillator is inputted into a mixer which measures the frequency shift by comparing the frequency of the effected electromagnetic signal with a known reference frequency to determine a difference value which indicates whether the spin torque oscillator is in close proximity to either a first portion of low permeability or a second portion of high permeability, and wherein either a "1" or "0" bit is outputted according to the mixer output.

13. The method of claim 8 wherein the first portions comprise low permeability lines of varying width positioned on a substrate and wherein the reader is a magnetic tunnel junction reader that measures the percentage tunnel magnetoresistance change ($\Delta$TMR) resulting from placing the magnetic tunnel junction reader in the close proximity to the substrate and wherein the permeability is determined by negative or positive changes in the tunnel magnetoresistance.

14. The method of claim 13 wherein the first portions comprise low permeability lines in a range of approximately 1 nm to 100 microns wide and the low permeability lines are spaced apart a distance in the range of 1 nm to 50 microns, and wherein the magnetic tunnel junction reader comprises a sensor having a height above the low permeability lines in the range of 1 nm to 25 microns and a magnetic field in the range of approximately 5-3000 Oersted.

15. The method of claim 8 wherein magnetic probe field comprises an external magnetic field and the response of the reader when the reader is in close proximity to the first portions of low permeability comprises a variation in a microwave frequency outputted from the reader different from a predetermined threshold value.

16. The method of claim 15 wherein the reader comprises a spin torque oscillator that radiates an electromagnetic signal which is effected by the first portion or second portion to be measured and wherein the effected magnetic field modifies the frequency of the spin torque oscillator such that a frequency shift is observed, and wherein resultant microwave radiation is compared to a reference frequency using a mixer and comparator to determine whether the shift in frequency is sufficient to indicate whether the first or second portion have low permeability or high permeability and wherein the mixer output is further inputted into the comparator which compares the difference value to a predetermined frequency shift, and based upon whether the magnitude of the difference value is greater than a predetermined frequency shift, either a "1" or "0" bit is outputted.

17. The method of claim 8 wherein the reader is a magnetoresistive reader and the response of the magnetoresistive reader when the reader is in close proximity to the first portions of low permeability comprises a variation in the magnetoresistance outputted from the reader different from a predetermined threshold value.

18. The method of claim 17 wherein the reader is a magnetic tunnel junction reader and wherein the response of the reader is a measurement of the magnetoresistance which is compared to a known reference magnetoresistance to determine whether the reader is in close proximity to either a first portion of low permeability or a second portion of high permeability.

19. The method of claim 18 wherein the response of the reader powered by a constant current source is inputted into a difference analyzer for comparing the measurement of magnetoresistance voltage to a known predetermined voltage.

20. The system for storing information in a nonvolatile memory comprising:
   a medium comprising magnetic material having at least one first portion of low permeability and at least one second portion of high permeability; the portions of low permeability being formed in the medium by heating the portions with a laser, hot tip or joule heating;
   at least one magnet configured to provide;
   a spin torque oscillator reader comprising a sensor for reading information by placing the sensor in close proximity to one of a first or second portion and measuring the microwave frequency shift outputted by the spin torque oscillator;
   a mixer operatively connected to the spin torque oscillator which determines a frequency differential between the outputted frequency and a predetermined frequency;
   a comparator operatively associated with the mixer for comparing the frequency differential to a threshold frequency differential;
   at least one processor operatively associated with the comparator for outputting a binary bit in response to whether or not the frequency differential exceeds the threshold differential.

* * * * *